(12) United States Patent
Nii

(10) Patent No.: US 6,822,300 B2
(45) Date of Patent: Nov. 23, 2004

(54) SEMICONDUCTOR MEMORY DEVICE

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/293,291

(22) Filed: Nov. 14, 2002

(65) Prior Publication Data

US 2003/0090924 A1 May 15, 2003

(30) Foreign Application Priority Data

Nov. 14, 2001 (JP) ......................................... 2001-348305
May 21, 2002 (JP) ......................................... 2002-146560

(51) Int. Cl.$^7$ ............................................. H01L 29/72
(52) U.S. Cl. ...................... 257/390; 257/391; 257/394; 257/396
(58) Field of Search ............................... 257/390, 391, 257/394, 396, 303; 365/54, 63, 154, 156, 230.05

(56) References Cited

U.S. PATENT DOCUMENTS 5,930,163 A    7/1999  Hara et al.
6,347,062 B2 *  2/2002  Nii et al. .................... 257/390

FOREIGN PATENT DOCUMENTS

JP    10-178110    6/1998
JP    2001-28401   1/2001

OTHER PUBLICATIONS

K. Noda et al., "A 1.9–$\mu m^2$ Loadless CMOS Four–Transistor SRAM Cell in a 0.18–$\mu m$ Logic Technology," IEDM (International Academic Journal), 1998, pp. 643–646.

Kenji Noda et al., "An Ultrahigh–Density High–Speed Loadless Four–Transistor SRAM Macro with Twisted Bitline Architecture and Triple–Well Shield," IEEE Journal of Solid State Circuits (International Thesis Journal), Mar. 2001, pp. 510–513, vol. 36 No. 3.

* cited by examiner

Primary Examiner—Edward Wojciechowicz
(74) Attorney, Agent, or Firm—Burns, Doane, Swecker & Mathis, L.L.P.

(57) ABSTRACT

A semiconductor memory device is provided with: first and second access PMOS transistors formed on N well regions; first and second driver NMOS transistors formed on a P well region; a word line connected to the gates of first and second access PMOS transistors; and first and second bit lines connected to the sources of first and second access PMOS transistors, respectively. Then, N-type diffusion regions and P-type diffusion regions extend in the same direction while polysilicon interconnections extend in the same direction.

16 Claims, 25 Drawing Sheets

US 6,822,300 B2

SEMICONDUCTOR MEMORY DEVICE

BACKGROUND OF THE INVENTION

1. Field of the Invention

The present invention relates to a semiconductor memory device, and more particularly to a memory cell structure of a semiconductor memory device such as a loadless-type CMOS static memory (hereinafter referred to as "SRAM (Static Random Access Memory)") or a loadless-type associative memory (CAM: Content Addressable Memory).

2. Description of the Background Art

FIG. 31 is a view showing the conventional layout configuration of a loadless-type SRAM memory cell formed of four transistors. An equivalent circuit diagram thereof is shown in FIG. 19.

This type of SRAM is shown in, for example, "A 1.9-um$^2$ Loadless CMOS Four-Transistor SRAM Cell In a 0.18-um Logic Technology," in the international academic journal IEDM, pp. 643–646, 1998 or in "An Ultrahigh-Density High-Speed Loadless Four-Transistor SRAM Macro with Twisted Bitline Architecture and Triple-Well Shield," in the international thesis journal IEEE JSSC, VOL. 36, No. 3, March 2001.

As shown in FIG. 31, a memory cell 1 has four MOS (metal oxide semiconductor) transistors. Concretely, memory cell 1 has NMOS transistors N1, N2 formed in a P well and PMOS transistors P1, P2 formed in an N well.

NMOS transistor N1 is formed in an intersection portion between an N-type diffusion region 2a and a polysilicon interconnection 3c while NMOS transistor N2 is formed in an intersection portion between an N-type diffusion region 2b and a polysilicon interconnection 3b. PMOS transistor P1 is formed in an intersection portion between a P-type diffusion region 2c and a polysilicon interconnection 3a while PMOS transistor P2 is formed in an intersection portion between a P-type diffusion region 2d and a polysilicon interconnection 3a.

PMOS transistors P1 and P2 are access transistors while NMOS transistors N1 and N2 are driver transistors. Diffusion regions 2a to 2d, respectively, are connected to upper layer wires via contact holes 4a to 4h.

In the layout configuration shown in FIG. 31, a word line WL is arranged in the lateral direction. Contrarily, a pair of bit lines BL1 and BL2 is arranged in the longitudinal direction. As shown in FIG. 23, the layout configuration of one bit is long in the longitudinal direction and bit lines become long according to such a layout configuration.

As described above, the SRAM memory cell of a four transistor configuration according to the prior art becomes long in the bit line direction and, therefore, the wire capacitance of the bit lines becomes large. In addition, the interval between bit lines BL1 and BL2 becomes narrow so that the capacitance between the bit lines also becomes large. Therefore, there is a problem that the access time is slow.

Furthermore, the direction of the gates and diffusion regions of access transistors P1 and P2 and the direction of the gates and diffusion regions of driver transistors N1 and N2 differ so that the dispersion of the width of the patterns or of the pattern formation positions for forming the gates, and the like, becomes large after photolithographic processing. Therefore, the dispersion of the width or of the formation positions of the gates, and the like, becomes great.

In the case that the dispersion of the gate width, and the like, becomes great, the characteristics of each of the above described transistors fluctuate. In addition, in the case that the formation position of, for example, polysilicon interconnection 3c shifts in the left to right direction in FIG. 23, polysilicon interconnection 3c and contact hole 4a or 4b are short circuited while in the case that the formation position of polysilicon interconnection 3a shifts in the upward to downward direction in FIG. 23, polysilicon interconnection 3a and contact hole 4e to 4g are short circuited. When a gate pattern shifts in any direction, upward, downward, to the left or to the right, there is a possibility that the gate pattern forms a short circuit with a contact hole that is supposed to be isolated and, therefore, there is a problem that it is difficult to secure a margin against dispersion occurring during manufacture due to a mask shift, or the like.

Above described problems may occur not only in a memory cell of a loadless four-transistors type SRAM but also in a memory cell of a loadless four-transistors type CAM.

SUMMARY OF THE INVENTION

The present invention is made to solve the above described problems. An object of the present invention is to reduce the wire capacitance of bit lines and the capacitance between bit lines and to secure a margin concerning dispersion in manufacture of a semiconductor memory device such as an SRAM or a CAM.

A semiconductor memory device according to one aspect of the present invention includes: second and third wells of a second conductive type, formed on both sides of a first well of a first conductive type; first and second access MOS transistors of the first conductive type, formed on said second or third well; first and second driver MOS transistors of the second conductive type, formed on said first well; a word line connected to the gates of the first and second access MOS transistors, and extending in the direction along which the first, second and third wells are aligned; and first and second bit lines connected to the sources of the first and second access MOS transistors, respectively, and extending in the direction perpendicular to the direction along which the first, second and third wells are aligned. Then, first and second diffusion regions of the first conductive type for forming the sources/drains of the first and second access MOS transistors and third and fourth diffusion regions of the second conductive type for forming the sources/drains of the first and second driver MOS transistors extend in the same direction, and the gates of the first and second access MOS transistors and the gates of the first and second driver MOS transistors extend in the same direction.

As described above, the first and second bit lines extend in the direction perpendicular to the direction along which the first to third wells are aligned and, thereby, the first and the second bit lines can be made short and the spaces between the bit lines can be made wide. Furthermore, the above described first, second, third and fourth diffusion regions extend in the same direction while the gates of the access MOS transistors and the gates of the driver MOS transistors extend in the same direction and, thereby, the dispersion in the width of the patterns and in the formation positions of the patterns for forming the gates, and the like, can be kept small after photolithographic processing. In addition, in the case that the gates shift in the direction of their extension (longitudinal direction), short circuiting can be avoided between the gates and contact holes that are provided on both sides of the gates in the width direction of the gates.

It is preferable to arrange the first and second access MOS transistors, respectively, on the above described second and third wells. Thereby, the space between the first and second bit lines can be secured widely.

It is preferable to further provide a conductive part for directly connecting the drain of the first access MOS transistor and the drain of the first driver MOS transistor. Example of this conductive part includes a metal wire for directly connecting between contact parts formed on the above described drains or the integration (shared contact) of these contact parts formed of a conductive part filled in into the space over and between the drains.

By providing such a conductive part, the drains can be connected without the intervention of the gates of the driver MOS transistors so that the resistance of the connection between the drains can be reduced.

It is preferable for the gates of the above described first and second access MOS transistors and gates of the first and second driver MOS transistors to extend along a line in the direction perpendicular to the direction in which the first, second and third wells extend. Thereby, dispersion in gate width or in the formation position of the gates can be reduced and, even in the case that the gates shift in the direction of their extension, short circuiting can be avoided between the gates and the contact holes that are provided on both sides of the gates in the width direction of the gates.

A semiconductor memory device according to another aspect of the present invention includes: a first well of a first conductive type; a second well of a second conductive type; first and second access MOS transistors of the first conductive type, formed on the second well; first and second driver MOS transistors of the second conductive type, formed on the first well; a word line connected to the gates of the first and second access MOS transistors extending in the direction along which the first and second wells are aligned; and first and second bit lines that connected to the sources of the first and second access MOS transistors, respectively, and extending in the direction perpendicular to the direction of extension of the word line. Then, first and second diffusion regions of the first conductive type for forming the sources/drains of the first and second access MOS transistors and third and fourth diffusion regions of the second conductive type for forming the sources/drains of the first and second driver MOS transistors extend in the same direction while the gates of the first and second access MOS transistors and the gates of the first and second driver MOS transistors extend in the same direction.

In the case of this aspect also, the first and second bit lines extend in the direction perpendicular to the direction along which the first and second wells are aligned and, therefore, the first and second bit lines can be made short and the intervals between the bit lines can be secured widely. In addition, the first to fourth diffusion regions extend in the same direction while the gates of the access MOS transistors and the gates of the driver MOS transistors extend in the same direction in the same manner as in the first aspect and, therefore, dispersion in the width or the formation position of the gates, or the like, can be made small and a shift of the gates in the longitudinal direction to a certain degree can be allowed.

The above described semiconductor memory device may include: first and second MOS transistors of the second conductive type formed in the above described first well; a word line for read out, connected to gate of the second MOS transistor; and a bit line for read out, connected to the source of the second MOS transistor. In this case, the gate of the first MOS transistor is connected to the gate of the second driver MOS transistor, the drain of the first MOS transistor is set at the ground potential, fifth and sixth diffusion regions of the second conductive type for forming the sources/drains of the first and second MOS transistors and the first, second, third and fourth diffusion regions extend in the same direction and the gates of the first and second MOS transistors, the gates of the first and second access MOS transistors and the gates of the first and second driver MOS transistors extend in the same direction.

The spirit of the second aspect of the present invention can be applied to a two port memory cell that is provided with a port for read out in the above manner. In the case, also, the same effects as in the second aspect can be obtained.

A semiconductor memory device according to still another aspect of the present invention includes: a second well of a second conductive type formed adjacent to a first well of a first conductive type; first and second MOS transistors of the first conductive type formed on the second well; third and fourth MOS transistors of the second conductive type formed on the first well; a word line connected to the gates of the first and second MOS transistors and extending in the direction in which the first and second wells are aligned; and first and second bit lines connected to the sources of the first and second MOS transistors, respectively, and extending in the direction perpendicular to the direction in which the first and second wells are aligned. Then, first and second diffusion regions of the first conductive type for forming the sources/drains of the first and second MOS transistors and third and fourth diffusion regions of the second conductive type for forming the sources/drains of the third and fourth MOS transistors are made to extend in the same direction while the gates of the first and second MOS transistors and the gates of the third and fourth MOS transistors are made to extend in the same direction.

In the case of the present aspect, also, the first and second bit lines can be made short and a wide distance between bit lines can be secured. In addition, the first to fourth diffusion regions and the gates of the first to fourth MOS transistors are made to extend in the same direction, so that the width of patterns for forming the gates or the like after photolithography is carried out and the dispersion of the pattern formation position can be made small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following the embodiments of the present invention are described in reference to FIGS. 1 to 30.

First Embodiment

Figure 1:
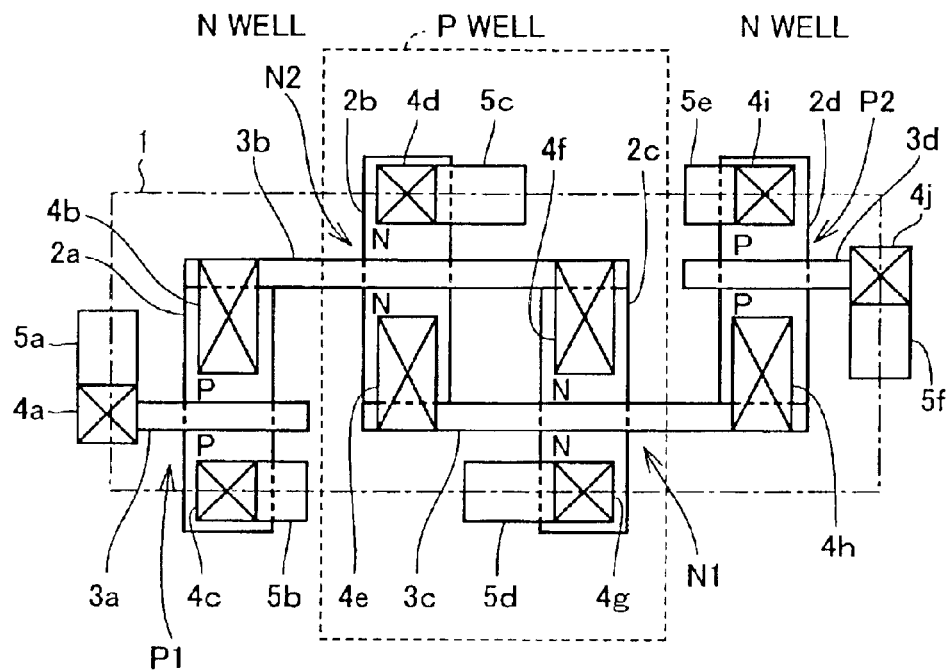
FIG. 1 is a view showing the layout configuration of a loadless-type SRAM memory cell according to a first embodiment of the present invention.
Figure 2:
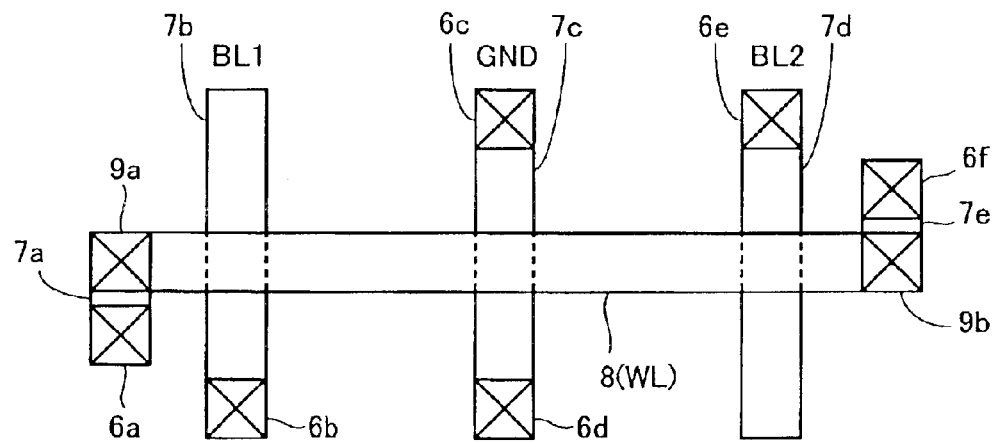
FIG. 2 is a view showing the layout configuration of the upper layer metal wiring of the memory cell shown in FIG. 1.
Figure 19:
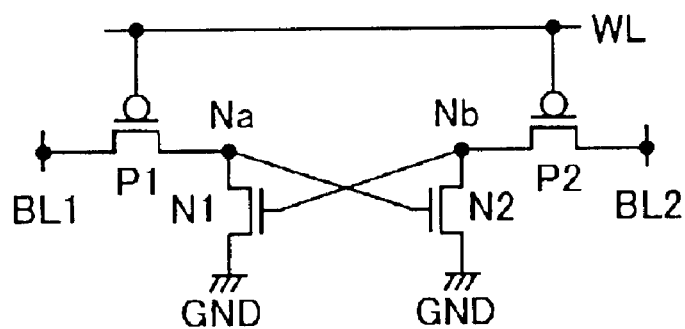
FIG. 19 is an equivalent circuit diagram of the loadless-type SRAM memory cells according to the first and second embodiments of the present invention.

FIGS. 1 and 2 are plan views of a memory cell 1 of a loadless-type SRAM (static semiconductor memory device) according to the first embodiment of the present invention. An equivalent circuit diagram of this memory cell 1 is shown in FIG. 19. Here, FIG. 1 shows the layout up to the first metal wiring and FIG. 2 shows the layout of the second and third metal wiring.

As shown in FIG. 1, N well regions are provided on both sides of a P well region. An N-type impurity, such as phosphorus, is selectively implanted into the P well region so as to form N-type diffusion regions 2b and 2c while a P-type impurity, such as boron, is selectively implanted into the N well regions so as to form P-type diffusion regions 2a and 2d.

N-type diffusion regions 2b and 2c as well as P-type diffusion regions 2a and 2d all extend in the same direction in the form of lines (extension direction of the P well region and the N well regions). Thereby, dispersion of the width or formation positions of the P well region or of the N well regions can be made small.

Memory cell 1 according to the present embodiment is formed of four MOS transistors. Concretely, memory cell 1 is formed of first and second access PMOS transistors P1 and P2 as well as of first and second driver NMOS transistors N1 and N2.

First and second access PMOS transistors P1 and P2 are formed in the N well regions, respectively, that are located on both sides of the P well region while first and second driver NMOS transistors N1 and N2 are formed in the central P well region.

First access PMOS transistor P1 is formed at an intersection portion of P-type diffusion region 2a that includes regions that become the source/drain and of a polysilicon interconnection 3a while second access PMOS transistor P2 is formed at an intersection portion of P-type diffusion region 2d that includes regions that become the source/drain and of a polysilicon interconnection 3d.

First driver NMOS transistor N1 is formed at an intersection portion of N-type diffusion region 2c that includes regions that become the source/drain and of a polysilicon interconnection 3c while second driver NMOS transistor N2 is formed at an intersection portion of N-type diffusion region 2b that includes regions that become the source/drain and of a polysilicon interconnection 3b.

As shown in FIG. 1, polysilicon interconnections 3a to 3d extend in the same direction. That is to say, polysilicon interconnections 3a to 3d extend in the direction (lateral direction in FIG. 1) perpendicular to the direction (longitudinal direction in FIG. 1) in which the P well region and the N well regions extend, which is the direction along which the P well region and the N well regions are aligned.

Thereby, dispersion of the width or formation positions of polysilicon interconnections 3a to 3d can be made small. In addition, at the same time, even in the case that polysilicon interconnections 3a to 3d are formed so as to shift in the lateral direction of FIG. 1, short circuiting between polysilicon interconnections 3a to 3d and contact holes (contact parts) 4b to 4i can be avoided.

A first interlayer insulating film, not shown, is formed so as to cover P-type diffusion regions 2a, 2d, N-type diffusion regions 2d, 2c and polysilicon interconnections 3a to 3d and contact holes 4a to 4j are created in this first interlayer insulating film so as to reach P-type diffusion regions 2a, 2d, N-type diffusion regions 2d, 2c and polysilicon interconnections 3a and 3d. A conductive layer for the connection to the upper wiring is filled in into these contact holes 4a to 4j. Here, contact holes 4a and 4j are gate contacts that reach the gates while contact holes 4b, 4e, 4f and 4h are shared contacts that reach the diffusion regions and the polysilicon gates.

In FIG. 1, the N-type diffusion region that is the drain of first driver NMOS transistor N1 and the P-type diffusion region that is the drain of first access PMOS transistor P1 are connected with an electrically low impedance via contact hole (shared contact) 4f, polysilicon interconnection 3b and contact hole (shared contact) 4b. This terminal becomes a memory node Na in the equivalent circuit diagram shown in FIG. 19.

The N-type diffusion region that is the drain of second driver NMOS transistor N2 and the P-type diffusion region that is the drain of second access PMOS transistor P2 are connected with an electrically low impedance via contact hole (shared contact) 4e, polysilicon interconnection 3c and contact hole (shared contact) 4h in the same manner as in the above. This terminal becomes a memory node Nb in the equivalent circuit diagram shown in FIG. 19.

First metal wires 5a to 5f are formed on the first interlayer insulating film. First metal wire 5a is formed above contact hole 4a, first metal wire 5b is formed above contact hole 4c, first metal wire 5c is formed above contact hole 4d, first metal wire 5d is formed above contact hole 4g, first metal wire 5e is formed above contact hole 4i and first metal wire 5f is formed above contact hole 4j.

Next, in reference to FIG. 2, second metal wires 7a to 7e are formed via the second interlayer insulating film, not shown, above first metal wires 5a to 5f. Second metal wires 7a and 7e are connected to first metal wires 5a and 5f, respectively, via first via holes 6a and 6f provided in the second interlayer insulating film. Second metal wires 7b and 7d are connected to first metal wires 5b and 5e, respectively, via first via holes 6b and 6e so as to become bit lines BL1 and BL2. Second metal wire 7c is connected to first metal wires 5c and 5d via first via holes 6c and 6d so as to become the ground line (GND line).

Portions of N-type diffusion regions 2c and 2b within the P well region become source terminals of driver NMOS transistors N1 and N2, respectively, to which the GND potential is given via contact holes (diffusion contacts) 4g and 4d, first metal wires 5d and 5c as well as first via holes 6c and 6d.

Portions of P-type diffusion regions 2a and 2d within the N well region become source terminals of access PMOS transistors P1 and P2, respectively, to which bit lines BL1 and BL2 are, respectively, connected via contact holes (diffusion contacts) 4c and 4i, first metal wires 5b and 5e as well as first via holes 6b and 6e.

As shown in FIG. 1, the N well regions are provided on both sides of the P well region and first and second access PMOS transistors P1 and P2 are provided in the N well regions, respectively, and, thereby, as shown in FIG. 2, bit lines BL1 and BL2 can extend in the longitudinal direction (shorter side direction) of memory cell 1 so that the length of bit lines BL1 and BL2 can be made short. Thereby, the wire capacitance of bit lines BL1 and BL2 can be made small.

In addition, as shown in FIG. 2, the interval between bit lines BL1 and BL2 can be made large and, therefore, the capacitance between the bit lines can be reduced.

A third metal wire 8 is formed above second metal wires 7a to 7e via a third interlayer insulating film, not shown. This third metal wire 8 becomes a word line (WL). Third metal wire 8 extends in the direction along which the P well region and the N well regions are aligned, which is in the direction (lateral direction in FIG. 2) perpendicular to the direction in which each well region extends and is connected to second metal wires 7a and 7e via second via holes 9a and 9b.

Second metal wires 7a and 7e are connected to polysilicon interconnections (gate terminals) 3a and 3d via first via holes 6a and 6f, first metal wires 5a and 5f and contact holes 4a and 4j. Accordingly, polysilicon interconnections 3a and 3d and third metal wire (WL) 8 are connected.

By composing the layout as described above, the wire length of the bit lines can be made short in comparison with the cell according to the prior art and, therefore, increased access time speed can be achieved. In addition, since the orientations of the polysilicon gates become of the same direction, the control of gate dimensions becomes easy. Furthermore, since the diffusion regions are in the form of lines, the gate can be maintained at a constant width even in the case that the polysilicon gates shift in the upward to downward direction of FIG. 1 so that change in the transistor characteristics can be avoided.

Here, the read out and write in operations of data stored within the above described memory cell are the same as those of the conventional example, of which the descriptions are omitted.

Second Embodiment

Figure 3:
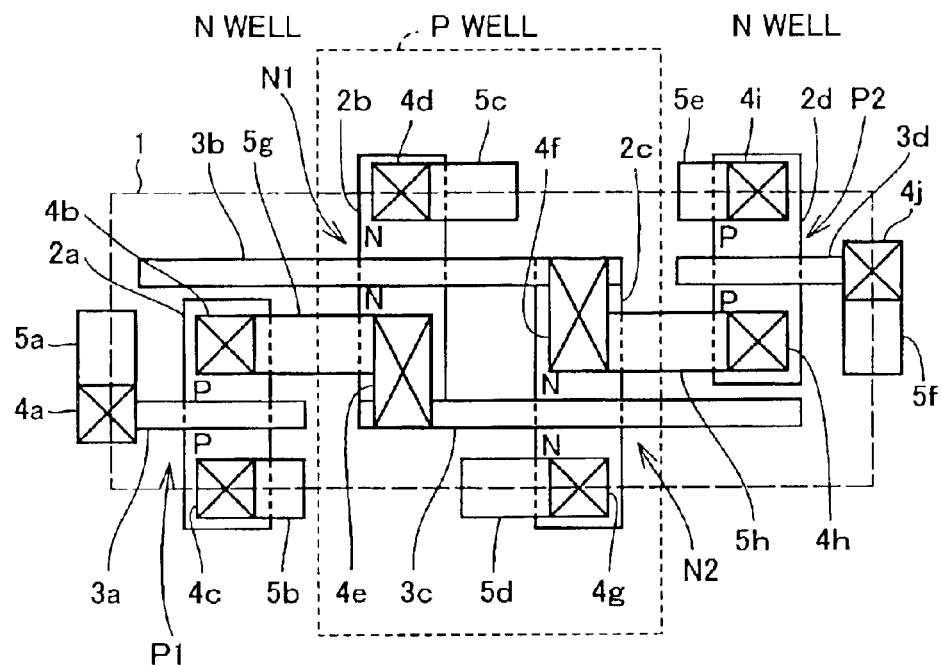
FIG. 3 is a view showing the layout of a loadless-type SRAM memory cell according to a second embodiment of the present invention.
Figure 4:
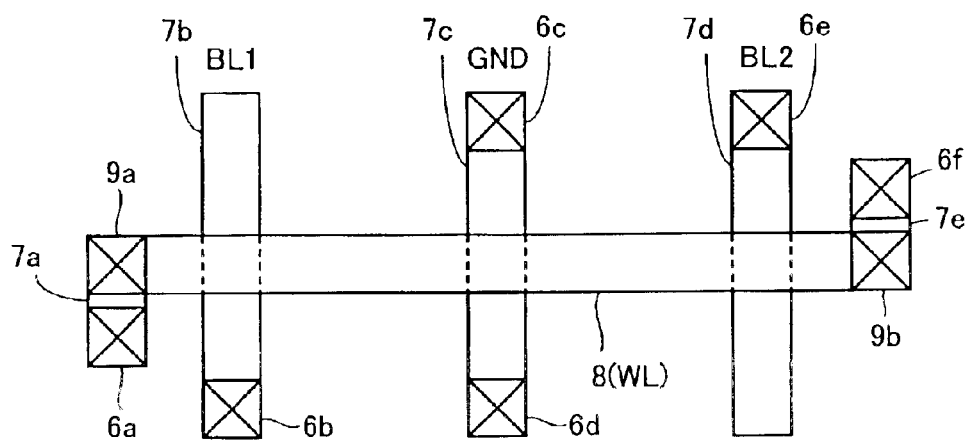
FIG. 4 is a view showing the layout configuration of the upper layer metal wiring of the memory cell shown in FIG. 3.

Next, the second embodiment of the present invention is described in reference to FIGS. 3 and 4. FIGS. 3 and 4 are plan views showing layouts of an SRAM memory cell of the second embodiment. FIG. 3 shows a layout up to and including the first metal wiring and FIG. 4 shows a layout of the second and third metal wiring. Here, the equivalent circuit diagram of this memory cell is the same as of the case of the first embodiment.

The main point that differs from the first embodiment is the point wherein the drains of access PMOS transistors P1 and P2 and the drains of driver NMOS transistors N1 and N2 are directly connected with metal wires without the intervention of polysilicon gates. Concretely, contact holes 4b and 4e are connected with a first metal wire 5g while contact holes 4f and 4h are connected with a first metal wire 5h.

At the same time, the arrangements of NMOS transistors N1 and N2 are opposite to those of the case of the first embodiment so that P-type diffusion regions 2a and 2d are located in positions away from polysilicon interconnections 3b and 3c. The configurations of the parts other than this part are approximately the same as of the first embodiment. Therefore, the same effects as of the first embodiment can be obtained.

A shared contact makes a shared connection between a diffusion region and a polysilicon gate via one shared contact hole. However, there is a problem caused during manufacture wherein the dispersion of the contact resistance thereof is large due to a mask shift, and the like, at the time of manufacture. Accordingly, the smaller the resistance is, the greater, and this is better, the effect it has of the lowering of the withdrawal current at the time of read out operation or write in operation.

Therefore, the number of shared contacts can be reduced in comparison with the first embodiment as shown in FIG. 3 by directly connecting predetermined contact holes with first metal wires as described above. That is to say, there is only one shared contact along a path of a withdrawal current so that the resistance value can be lowered. In addition, the dispersion caused during manufacture has smaller effects. As a result, the withdrawal current can be increased so that the operation becomes stable and access time speed can be made faster.

Here, a technique other than that described above may be used to connect respective drains in the case that the drains of access PMOS transistors P1 and P2 and the drains of driver NMOS transistors N1 and N2 can be directly connected with metal wires without the intervention of polysilicon gates.

For example, in the first embodiment, the positions of NMOS transistors N1 and N2 may be switched so that contact holes 4b and 4f are integrated while contact holes 4e and 4h are integrated. In this case, also, there is only one shared contact that obtains the same effects as of the above described example. In addition that that, a contact area between a contact hole and a diffusion region as well as a polysilicon gate can be increased and, thereby, the contact resistance can be reduced.

In addition, by using local wiring, the drains of access PMOS transistors P1 and P2 and the drains of driver NMOS transistors N1 and N2 may be connected. In this case, also, the same effects can be expected.

Third Embodiment

Figures 5, 6:
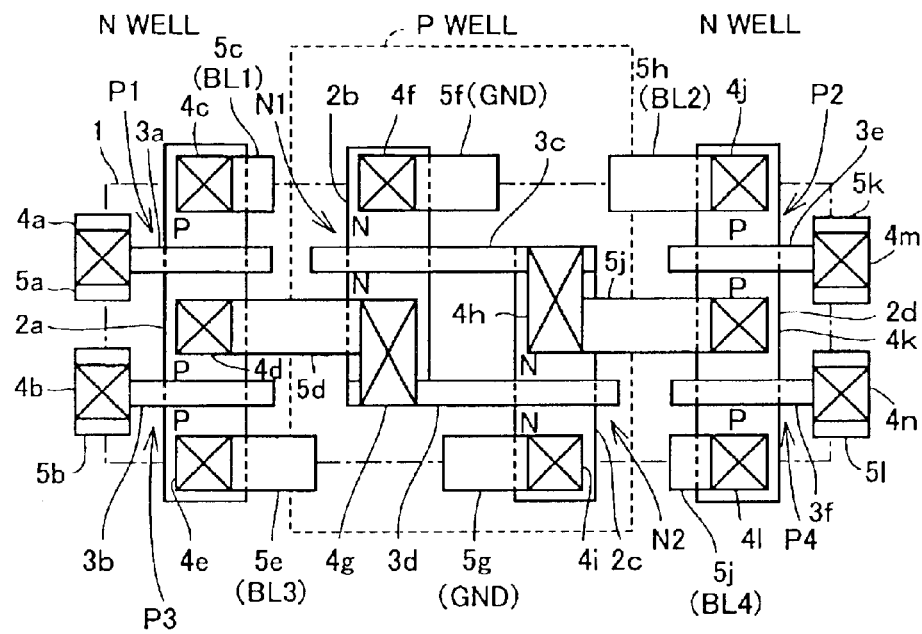
FIG. 5 is a view showing the layout configuration of a loadless-type SRAM dual port memory cell according to a third embodiment of the present invention.
FIG. 6 is a view showing the layout configuration of the upper metal wiring of the memory cell shown in FIG. 5.
Figure 20:
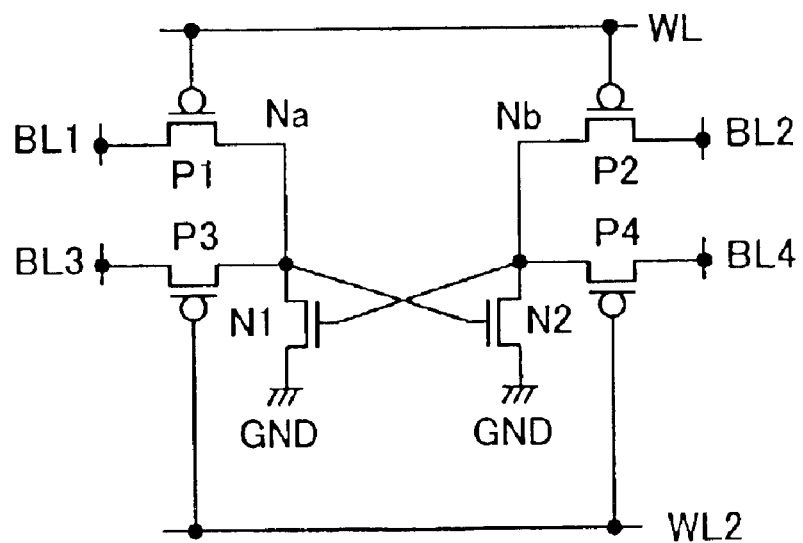
FIG. 20 is an equivalent circuit diagram of the loadless-type SRAM dual port memory cells according to the third and fourth embodiments of the present invention.

Next, the third embodiment of the present invention is described in reference to FIGS. 5 and 6. The third embodiment is an application example of the above described example. FIGS. 5 and 6 show layouts of a two port memory cell of a loadless-type SRAM cell. FIG. 5 shows a layout up to, and including, first metal wiring and FIG. 6 shows a layout of second and third metal wiring. The equivalent circuit diagram of a memory cell 1 of the third embodiment is shown in FIG. 20.

The third embodiment is significantly characterized in that third and fourth access PMOS transistors P3 and P4 are added to the memory cell of the second embodiment. Concretely, as shown in FIG. 5, P-type diffusion region 2a is extended in the upward to downward direction of FIG. 5 so that a polysilicon interconnection 3b is formed above this extension portion while P-type diffusion region 2d is extended in the upward to downward direction of FIG. 5 so that a polysilicon interconnection 3f is formed above this extension portion.

In the present embodiment, also, P-type diffusion regions 2a and 2d, which include the sources/drains of third and fourth access PMOS transistors P3 and P4, and N-type diffusion regions 2b and 2c extend in the same direction. In addition, polysilicon interconnections 3a to 3f also extend in the same direction.

As shown in FIG. 6, third metal wires 8a and 8b that become a pair of word lines (WL1 and WL2) are provided. Third metal wire 8a is connected to polysilicon interconnection 3a via second via hole 9a, second metal wire 7a, first via hole 6g and contact hole 4a and is connected to polysilicon interconnection 3e via second via hole 9b, second metal wire 7h, first via hole 6i and contact hole 4m.

Third metal wire 8b is connected to polysilicon interconnection 3b via second via hole 9c, second metal wire 7b, first via hole 6h and contact hole 4b and is connected to polysilicon interconnection 3f via second via hole 9d, second metal wire 7i, first via hole 6j and contact hole 4n.

In addition, first and second bit lines BL1 and BL2 of the first port and third and fourth bit lines BL3 and BL4 of the second port are formed.

The configurations of the parts other than the above are approximately the same as of the second embodiment. Accordingly, the wire length of the bit lines can be made short in comparison with the conventional cell and increased access time speed can be achieved. In addition, control of the gate dimensions becomes easy.

Fourth Embodiment

Figure 7:
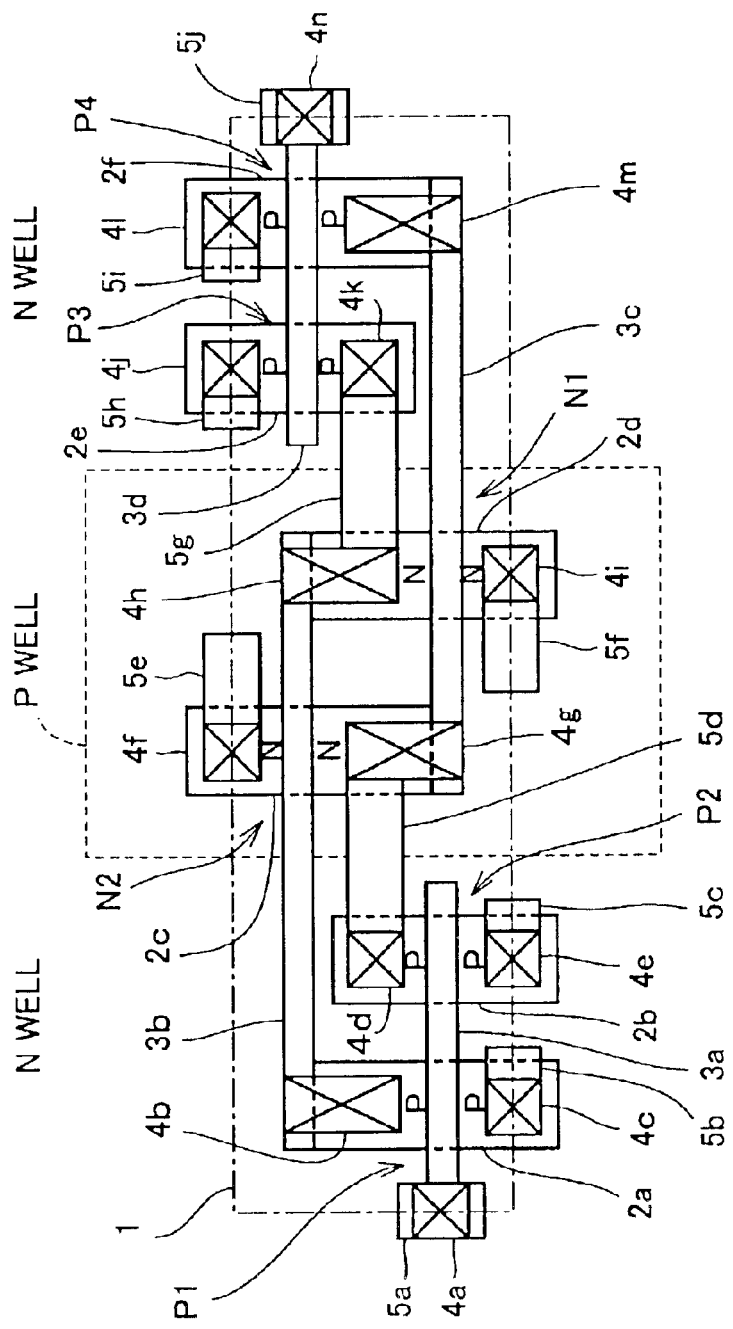
FIG. 7 is a view showing the layout configuration of a loadless-type SRAM dual port memory cell according to a fourth embodiment of the present invention.
Figure 8:
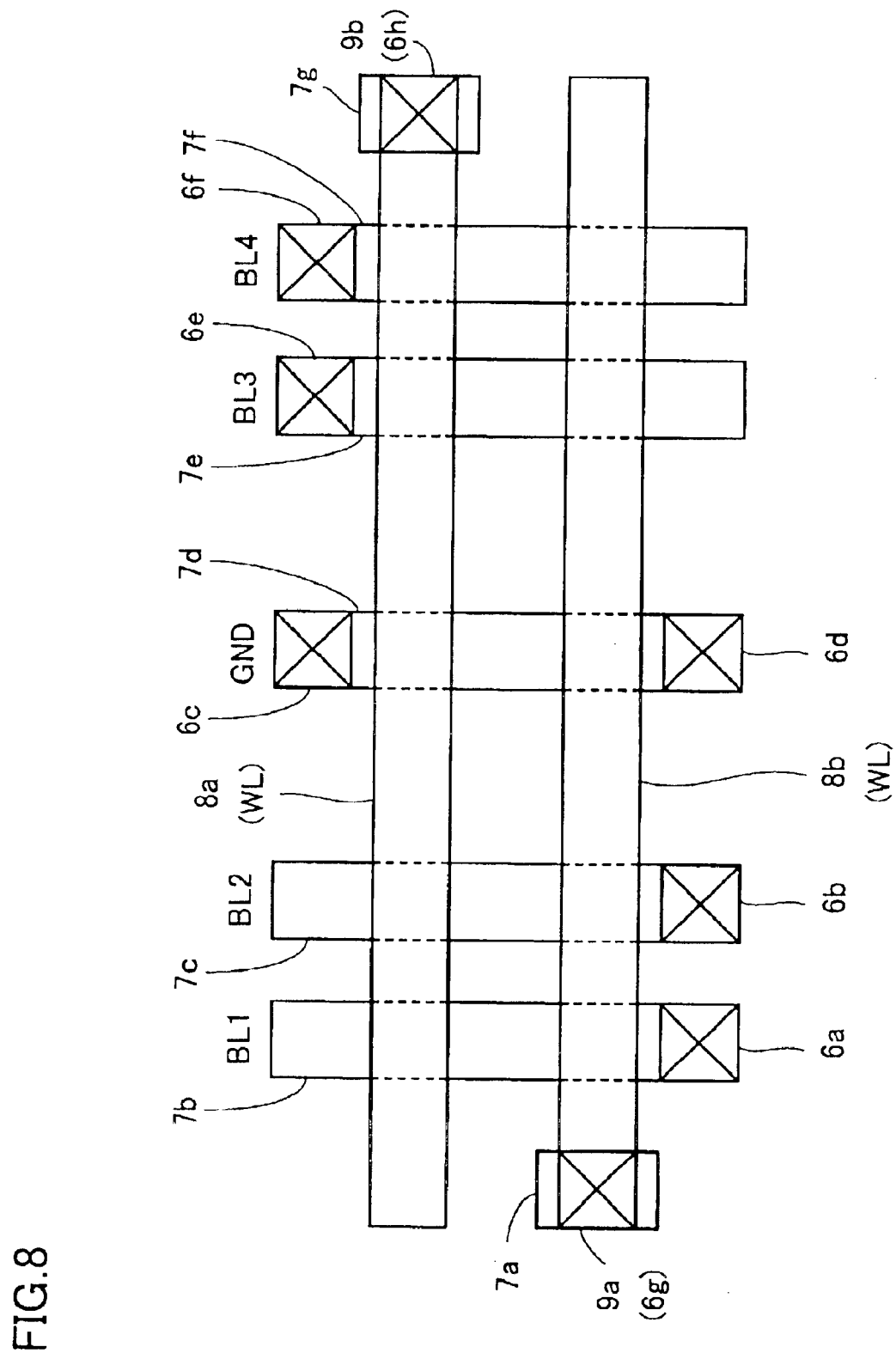
FIG. 8 is a view showing the layout configuration of the upper metal wiring of the memory cell shown in FIG. 7.

Next, the fourth embodiment of the present invention is described in reference to FIGS. 7 and 8. The fourth embodiment is a modified example of the third embodiment. FIGS. 7 and 8 show layouts of a two port memory cell of a loadless-type SRAM cell. FIG. 7 shows a layout up, and including, first metal wiring and FIG. 8 shows a layout of second and third metal wiring. The equivalent circuit diagram of the memory cell of the fourth embodiment is shown in FIG. 20.

In the fourth embodiment, the positions of first to fourth access PMOS transistors P1 to P4 are made to differ from those of the third embodiment. Concretely, as shown in FIG. 7, first and second access PMOS transistors P1 and P2 are arranged above the N well region, on the left side, and are aligned in the lateral direction of FIG. 7 while third and fourth access PMOS transistors P3 and P4 are arranged above the N well region, on the right side, and are aligned in the lateral direction. At the same time, the P-type diffusion region is divided for PMOS transistors P1 to P4 so that P-type diffusion regions 2a, 2b, 2e and 2f are provided and are aligned in the lateral direction.

In addition, as shown in FIG. 8, first and second bit lines BL1 and BL2 of the first port are arranged on the left side of the ground line (GND line) and third and fourth bit lines BL3 and BL4 of the second port are arranged on the right side of the ground line. That is to say, first and second bit lines BL1 and BL2 of the first port and third and fourth bit lines BL3 and BL4 of the second port are located in positions away from each other.

The configuration of the parts other than the above are approximately the same as of the third embodiment. Accordingly, increased access time speed can be achieved and control of the gate dimensions becomes easy in the same manner as of the case of the third embodiment.

In addition to that, bit lines BL1 and BL2 of the first port and bit lines BL3 and BL4 of the second port can be wired above the different N well regions, respectively, so as to be located in positions away from each other and, therefore, there is an advantage wherein interference between the ports can be prevented.

In the case that bit lines BL1 and BL2 of the first port and bit lines BL3 and BL4 of the second port are wired so as to adjoin each other, the effects of noise due to coupling capacitance easily increase. This is because when one of the bit lines fluctuates in potential from the VDD potential to the GND potential during the write in operation, crosstalk noise due to the coupling capacitance is added to the other adjoining bit line.

According to the read out operation, a microscopic potential gap between a bit line pair is amplified by a sense amplifier so as to be read out and there is a risk of mistaken read out in the case that bit lines BL1 and BL2 of the first port are during the write in operation while bit lines BL3 and BL4 of the adjoining second port are during the read out operation wherein crosstalk noise is added to bit lines BL3 and BL4.

In the fourth embodiment, however, the problem of interference between the ports can be avoided because the bit lines of the first and second ports do not adjoin each other, as shown in FIG. 8.

Fifth Embodiment

Figure 9:
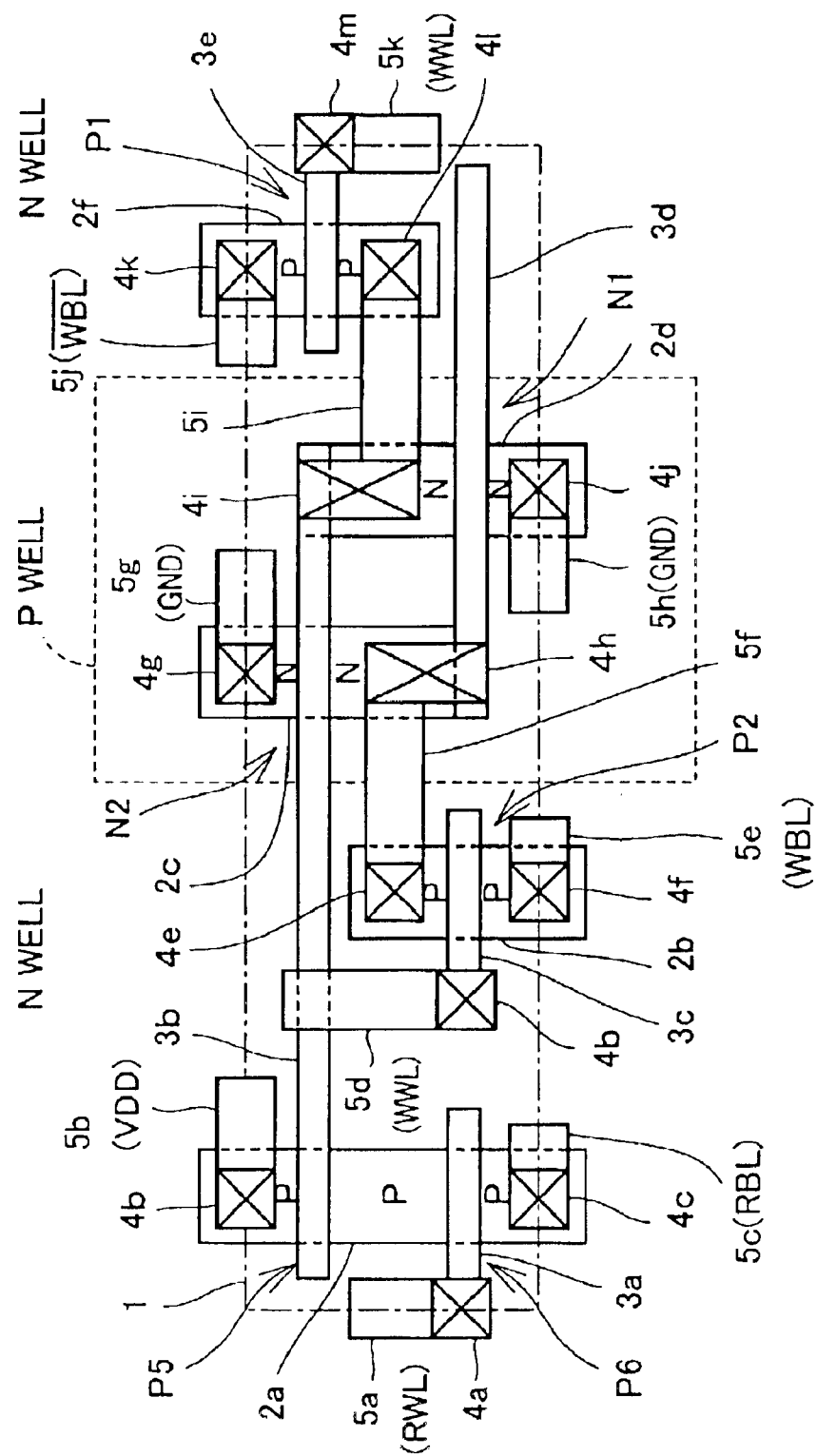
FIG. 9 is a view showing the layout configuration of a loadless-type SRAM multi-port memory cell according to a fifth embodiment of the present invention.
Figure 10:
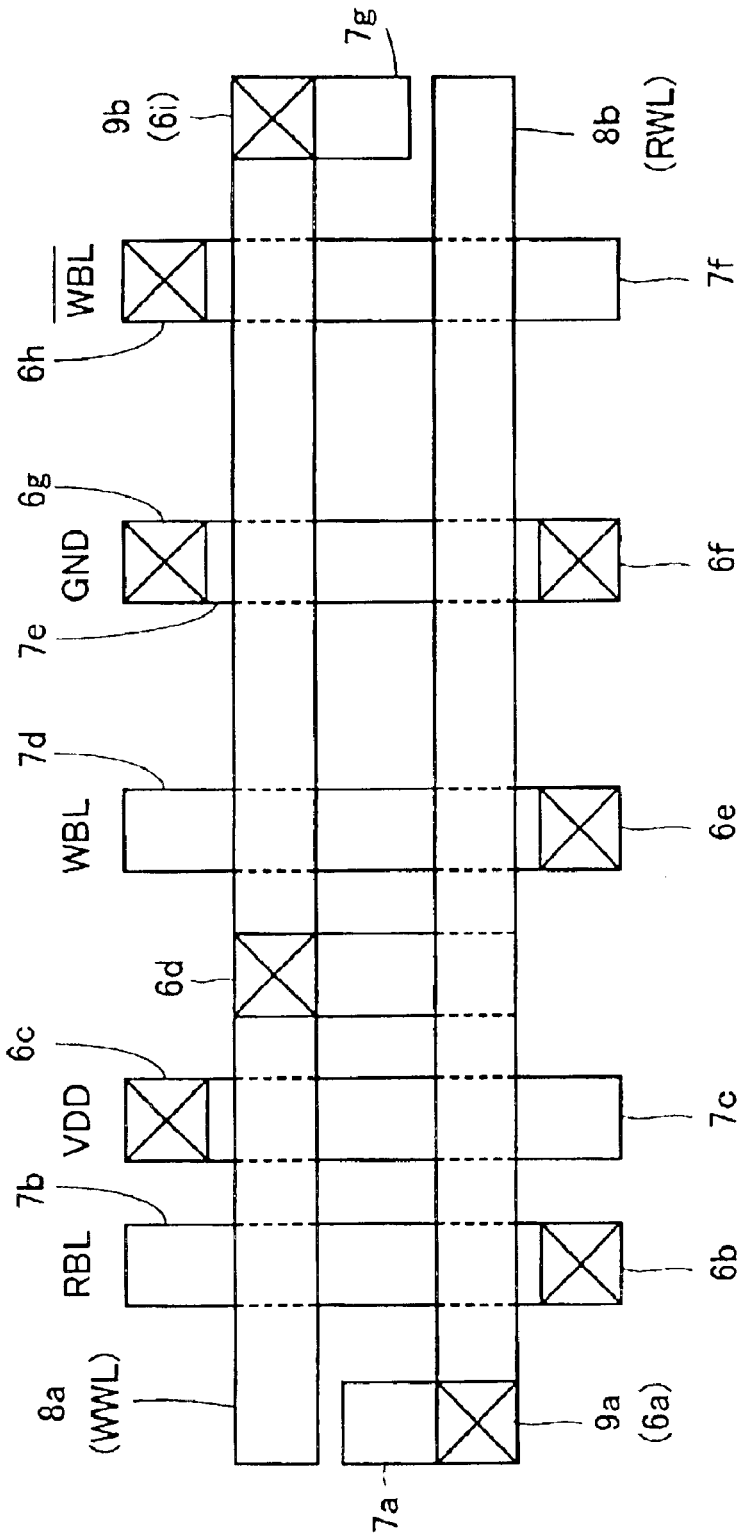
FIG. 10 is a view showing the layout configuration of the upper metal wiring of the memory cell shown in FIG. 9.

Next, the fifth embodiment of the present invention is described in reference to FIGS. 9 and 10. The fifth embodiment is the application of the present invention to a multi-port memory. That is to say, a memory cell 1 according to the present embodiment has the configuration of a two port memory cell wherein a buffer circuit dedicated to read out is provided inside of memory cell 1 of the loadless-type four transistor SRAM shown in the first embodiment.

FIGS. 9 and 10 are views showing layouts of the two port memory cell of the present embodiment provided with a port dedicated to read out. FIG. 9 shows a layout up to, and including, first metal wiring and FIG. 10 shows a layout of second and third metal wiring. The equivalent circuit diagram of the memory cell of the fifth embodiment is shown in FIG. 21.

As shown in FIG. 9, in the fifth embodiment, PMOS transistors P5 and P6 for read out are provided in the N well, on the left side. PMOS transistor P5 is provided at an intersection portion of P-type diffusion region 2a and polysilicon interconnection 3b while PMOS transistor P6 is provided at an intersection portion of P-type diffusion region 2a and polysilicon interconnection 3a.

In the present embodiment, also, P-type diffusion region 2a, which includes the sources/drains of PMOS transistors P5 and P6, P-type diffusion regions 2b and 2f and N-type diffusion regions 2c and 2d extend in the same direction. In addition, polysilicon interconnections 3a to 3e extend in the same direction.

Figure 21:
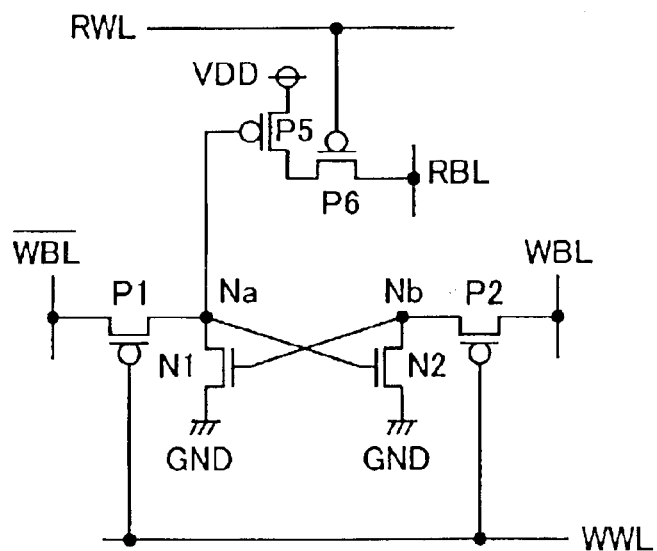
FIG. 21 is an equivalent circuit diagram of the loadless-type SRAM multi-port memory cells according to the fifth, sixth and ninth embodiments of the present invention.

As shown in FIGS. 10 and 21, a bit line RBL for read out (second metal wire 7b), a word line RWL for read out (third metal wire 8b), bit lines for write in WBL and /WBL (second metal wires 7d and 7f) and a word line WL for write in (third metal wire 8a) are provided.

As shown in FIG. 21, bit line RBL for read out is connected to the source of PMOS transistor P6 and the gate of PMOS transistor P6 is connected to word line RWL for read out. The source of PMOS transistor P5 is connected to power supply VLL and the drain of PMOS transistor P5 is connected to the drain of PMOS transistor P6.

The gate of PMOS transistor P5 is connected to memory node Na. Accordingly, the gate of PMOS transistor P5 is connected to the gate of second driver NMOS transistor N2, the source of first driver NMOS transistor N1 and the drain of first access PMOS transistor P1.

The basic configurations of the parts other than the above are the same as those of the third embodiment shown in FIG. 5. Accordingly, increased access time speed can be achieved and control of the gate dimensions becomes easy in comparison with the conventional cell.

The first port in the memory cell of the fifth embodiment is formed of first and second access PMOS transistor P1 and P2 while the second port is formed of PMOS transistors P5 and P6, word line RWL for read out and bit line RBL for read out.

In the case of a condition of no read out, bit line RBL is precharged in advance to the low (L) level. In addition, word line RWL is set at the high (H) level, that is to say, PMOS transistor P6 is set at the off condition. In the case that memory node Na in FIG. 21 is at L level, PMOS transistor P5 converts to the on condition.

When the read out operation is started and word line RWL changes from H level to L level, PMOS transistor P6 changes from the off condition to the on condition. Thereby, bit line RBL and power supply VDD convert to an electrically conductive condition via PMOS transistors P5 and P6. Therefore, bit line RBL changes from L level, which is a pre-charged level, to H level and the H level, which is the inverted data of memory node Na, is read out.

After that, when the word line returns to H level from L level, PMOS transistor P6 converts to the off condition so that bit line RBL and power supply VDD are electrically isolated from each other. Then, bit line RBL is again pre-charged to L level for the next read out so as to complete the read out operation.

On the other hand, in the case that memory node Na is at H level, PMOS transistor P5 converts to the off condition. When the read out operation is started and word line RWL changes from H level to L level, PMOS transistor P6 changes from the off condition to the on condition while PMOS transistor P5 is in the off condition and, therefore, bit line RBL stays at L level, which is the pre-charged level, without change. Thus, L level, which is the inverted data of memory node Na, is read out. After that, the word line returns to H level from L level so as to complete the read out operation.

As described above, the write in operation cannot be carried out at the second port and only the read out operation is carried out. As shown in FIG. 21, a buffer circuit for read out is provided inside of the memory cell and, therefore, bit line RBL and memory nodes Na and Nb are not electrically connected.

Though the read out operation can be carried out at the first port, there is a possibility that the stored data may be mistakenly rewritten when memory nodes Na and Nb are electrically connected to bit line pair WBL and /WBL via access PMOS transistors P1 and P2 at the time of the read out operation.

However, the destruction of stored data can be prevented at the time of the read out operation at the second port so that a stable read out operation can be carried out.

Here, though FIGS. 9, 10 and 21 show only the case of two ports, a multi-port memory cell of three ports, or more, can be obtained by connecting a circuit similar to PMOS transistor P5 or P6 to memory node Na or Nb.

Sixth Embodiment

Figure 11:
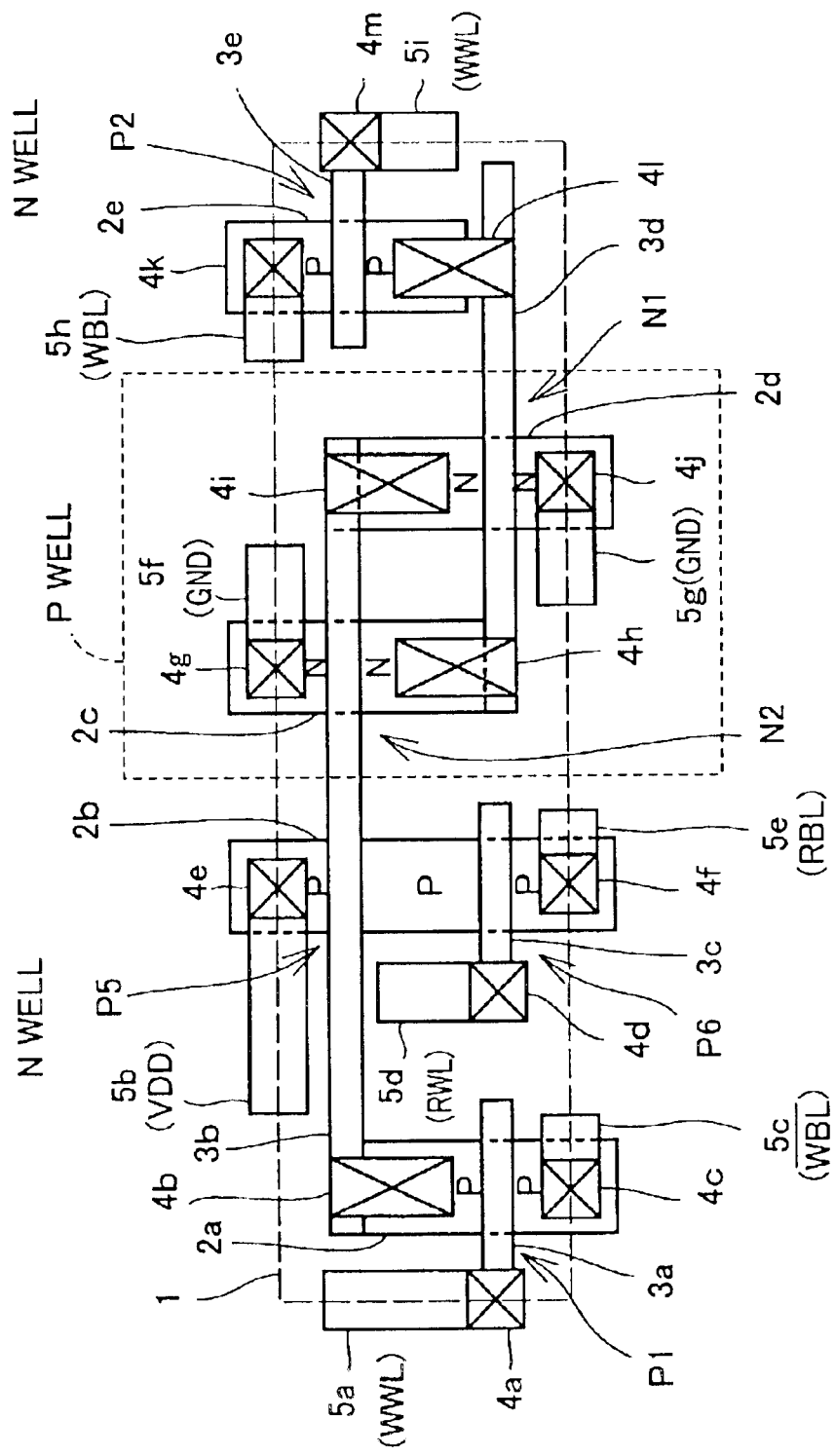
FIG. 11 is a view showing the layout configuration of a loadless-type SRAM multi-port memory cell according to a sixth embodiment of the present invention.
Figure 12:
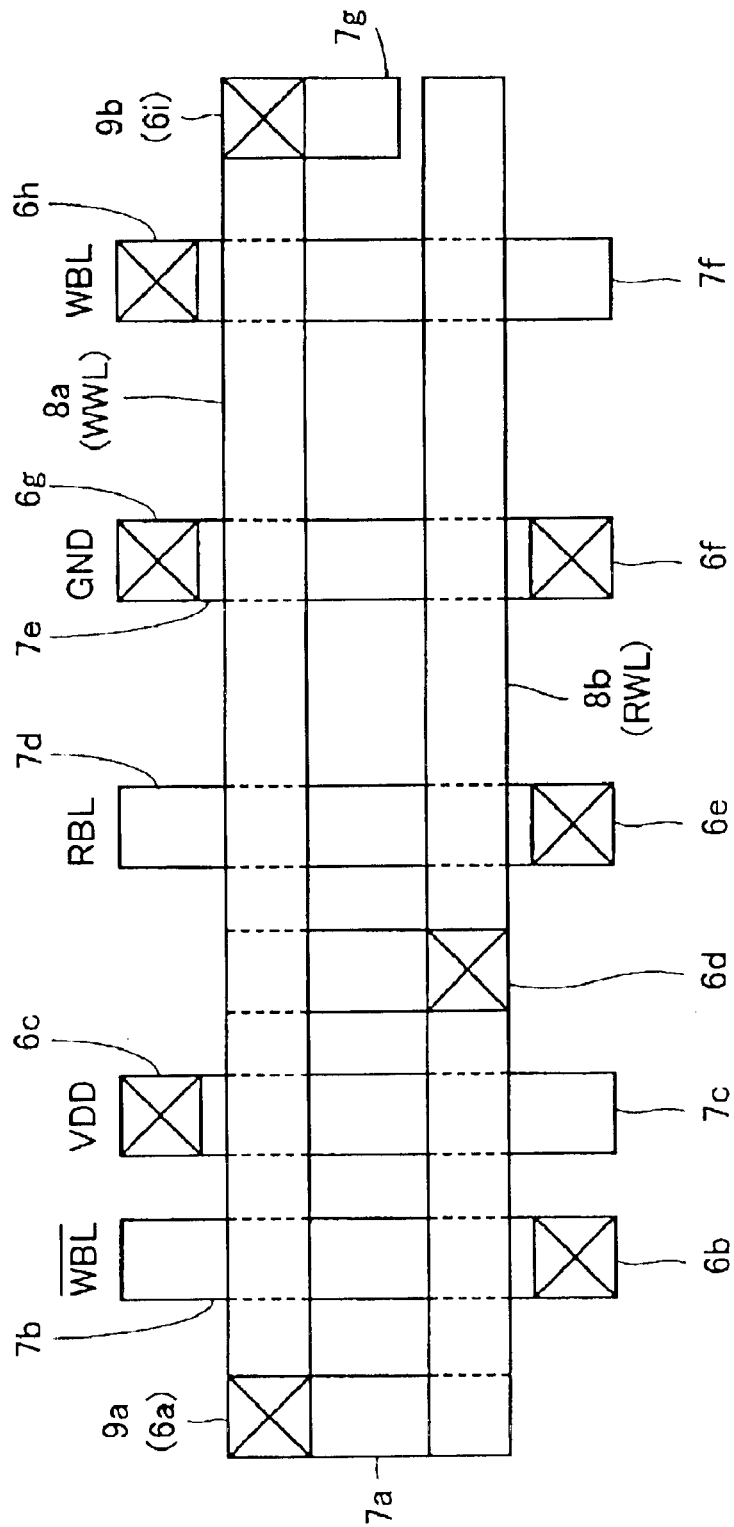
FIG. 12 is a view showing the layout configuration of the upper metal wiring of the memory cell shown in FIG. 11.

Next, the sixth embodiment of the present invention is described in reference to FIGS. 11 and 12. The sixth embodiment is a modified example of the fifth embodiment.

FIGS. 11 and 12 are views showing layouts of a two port memory cell of the present embodiment. FIG. 11 shows a layout up to, and including, first metal wiring and FIG. 12 shows a layout of second and third metal wiring. The equivalent circuit diagram of the memory cell of the sixth embodiment is the same as that shown in FIG. 21.

As shown in FIG. 11, in the sixth embodiment, the positions of access PMOS transistors P1 and P2 in the layout of the fifth embodiment shown in FIG. 10 are switched so that PMOS transistors P5 and P6 are arranged close to the P well region.

At the same time, as shown in FIG. 12, the positions of bit line pair WBL and /WBL and bit line RBL for read out are changed. The configurations of the parts other than this part are the same as those in the fifth embodiment. Accordingly, the same effects as of the embodiment can be obtained.

Seventh Embodiment

Figure 13:
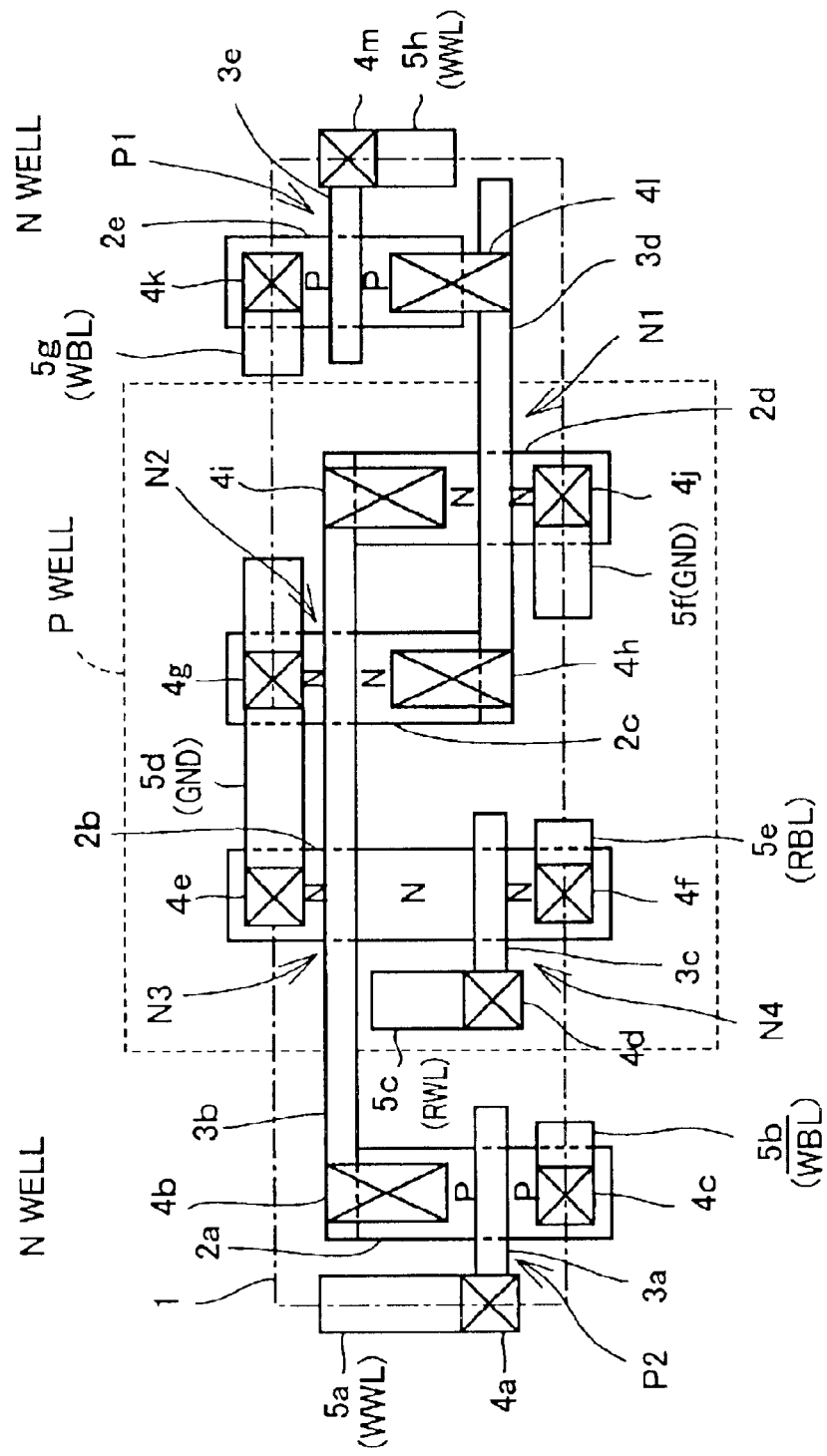
FIG. 13 is a view showing the layout configuration of a loadless-type SRAM multi-port memory cell according to a seventh embodiment of the present invention.
Figure 14:
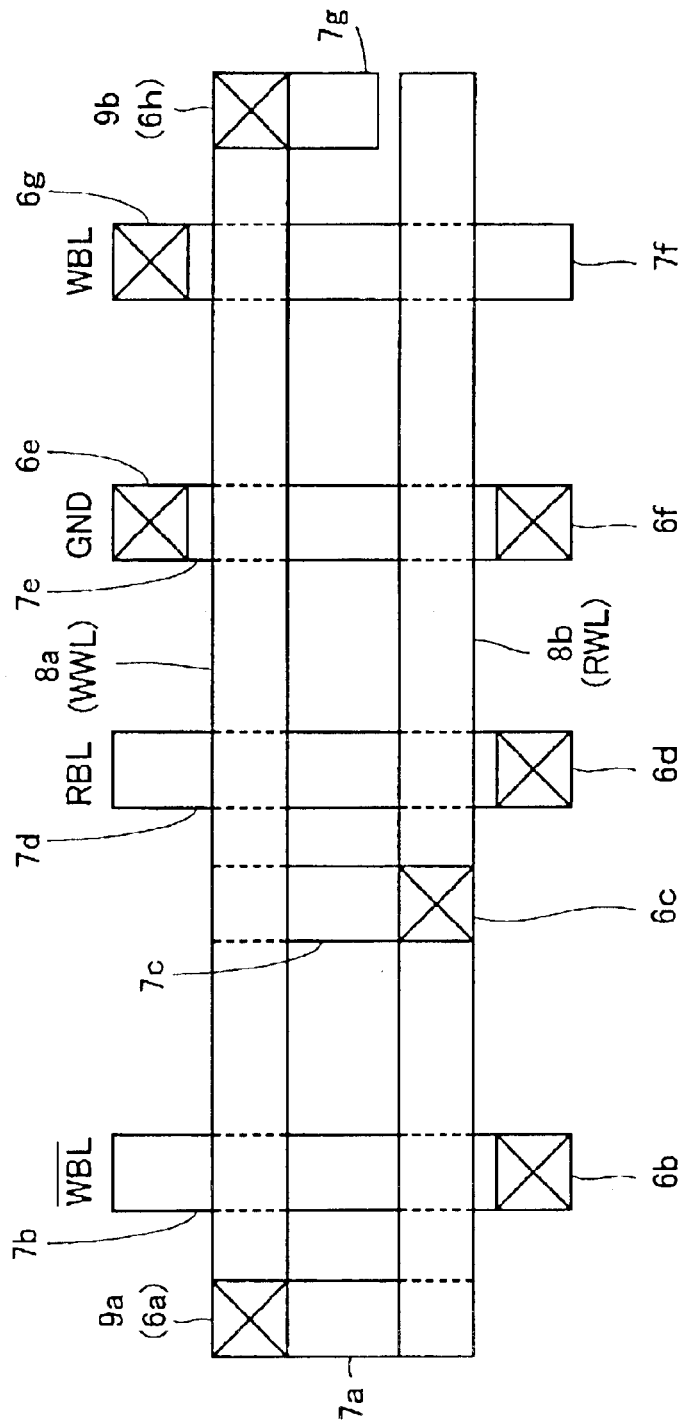
FIG. 14 is a view showing the layout configuration of the upper metal wiring of the memory cell shown in FIG. 13.

Next, the seventh embodiment of the present invention is described in reference to FIGS. 13 and 14. In the seventh embodiment, NMOS transistors N3 and N4 are provided instead of PMOS transistors P5 and P6 of the fifth and sixth embodiments so that the buffer circuit for read out is formed of NMOS transistors N3 and N4.

Thus, the second port is formed of NMOS transistors N3 and N4, word line RWL for read out and bit line RBL for read out. The basic structure of the parts other than this is approximately the same as in the fifth and sixth embodiments and, therefore, the same effects as of the fifth and sixth embodiments can be expected.

Figure 22:
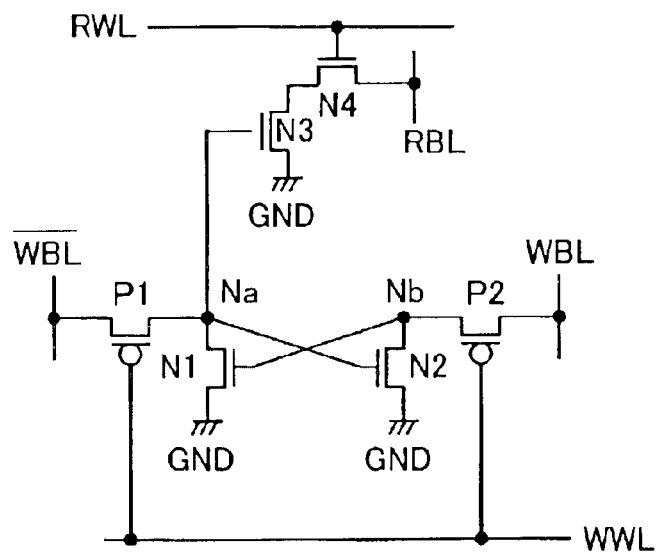
FIG. 22 is an equivalent circuit diagram of the loadless-type SRAM multi-port memory cells according to the seventh and eighth embodiments of the present invention.

FIGS. 13 and 14 are views showing layouts of a two port memory cell of the present embodiment. FIG. 13 shows a layout up to, and including, the first metal wiring while FIG. 14 shows a layout of the second and third metal wiring. The equivalent circuit diagram of the memory cell of the seventh embodiment is shown in FIG. 22.

As shown in FIG. 13, an N-type diffusion region 2b is provided in the P well region and polysilicon interconnections 3b and 3c are formed above this N-type diffusion region 2b. An NMOS transistor N3 is provided at an intersection portion of polysilicon interconnection 3b and N-type diffusion region 2b while an NMOS transistor N4 is provided at an intersection portion of polysilicon interconnection 3c and N-type diffusion region 2b.

In the present embodiment, also, N-type diffusion region 2b, which includes the sources/drains of NMOS transistors N3 and N4, P-type diffusion regions 2a and 2e and N-type diffusion regions 2c and 2d extend in the same direction. In addition, polysilicon interconnections 3a to 3e extend in the same direction.

As shown in FIG. 14, the layouts of bit line RBL for read out, word line RWL for read out, bit lines WBL and /WBL for write in, word line WWL for write in and the ground line (GND) are approximately the same as of the case in FIG. 12.

As shown in FIG. 22, bit line RBL for read out is connected to the source of NMOS transistor N4 while the gate of NMOS transistor N4 is connected to word line RWL for read out. The source of NMOS transistor N3 is connected to the drain of NMOS transistor N4 and the drain of NMOS transistor N3 is grounded (GND).

The gate of NMOS transistor N3 is connected to memory node Na. Accordingly, the gate of NMOS transistor N3 is connected to the gate of second driver NMOS transistor N2, to the source of first driver NMOS transistor N1 and to the drain of first access PMOS transistor P1.

Next, the operation of the memory cell of the present embodiment is described.

In reference to FIG. 22, in the case of the non-read out condition, bit line RBL is pre-charged to the high (H) level in advance. In addition, word line RWL is set at the low (L) level, that is to say, NMOS transistor N4 is set at the off condition. In the case that memory node Na in FIG. 21 is at the H level, NMOS transistor N3 converts to the on condition.

When the read out operation is started and word line RWL changes from the L level to the H level, NMOS transistor N4 changes from the off condition to the on condition. Thereby, bit line RBL and ground line GND convert to the electrically conductive condition via NMOS transistors N3 and N4. Therefore, bit line RBL changes from the H level, which is the pre-charged level, to the L level so that the L level, which is the inverted data of memory node Na, is read out.

After that, when the word line returns to the L level from the H level, NMOS transistor N4 is converted to the off condition and bit line RBL and ground line GND are electrically isolated. Then, bit line RBL is again pre-charged to the H level for the next read out so as to complete the read out operation.

On the other hand, in the case that memory node Na is set at the L level, NMOS transistor N3 is converted to the off condition. When the read out operation is started and word line RWL is changed from the L level to the H level, NMOS transistor N4 changes from the off condition to the on condition while bit line RBL does not change and stays at the H level, which is the pre-charged level because NMOS transistor N3 stays in the off condition. Thus, the H level, which is the inverted data of memory node Na, is read out. After that, the word line returns to the L level from the H level so as to complete the read out operation.

As described above, the write in operation is not carried out and only the read out operation is carried out at the second port and, therefore, the destruction of the stored data can be prevented at the time of the read out operation so as to carry out a stable read out operation at the second port in the same manner as in the case of the fifth and sixth embodiments. In addition, the number of contact holes and the number of via holes can be reduced in the present embodiment in comparison with the case of the fifth and sixth embodiments. Thereby, the manufacturing yield can be increased.

Eighth Embodiment

Figure 15:
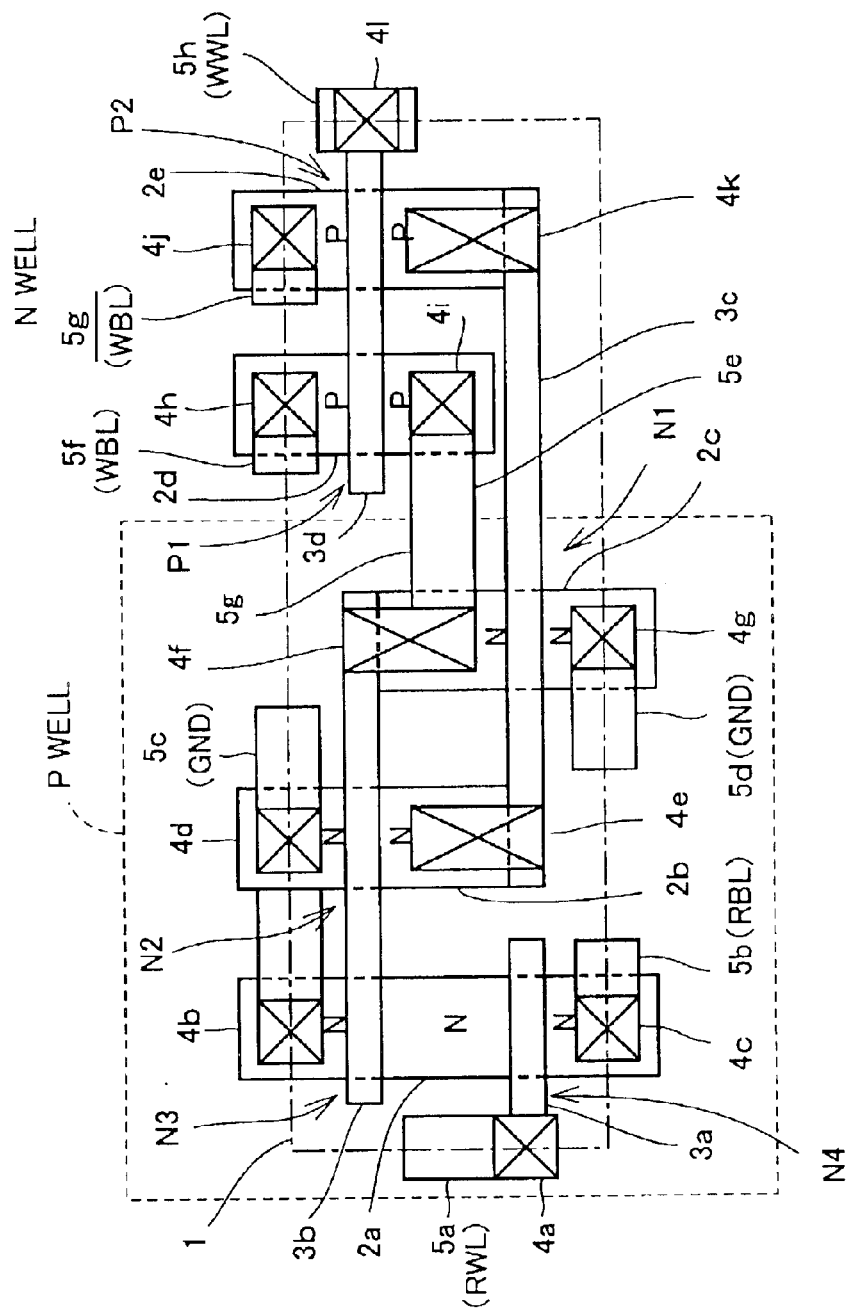
FIG. 15 is a view showing the layout configuration of a loadless-type SRAM multi-port memory cell according to an eighth embodiment of the present invention.
Figure 16:
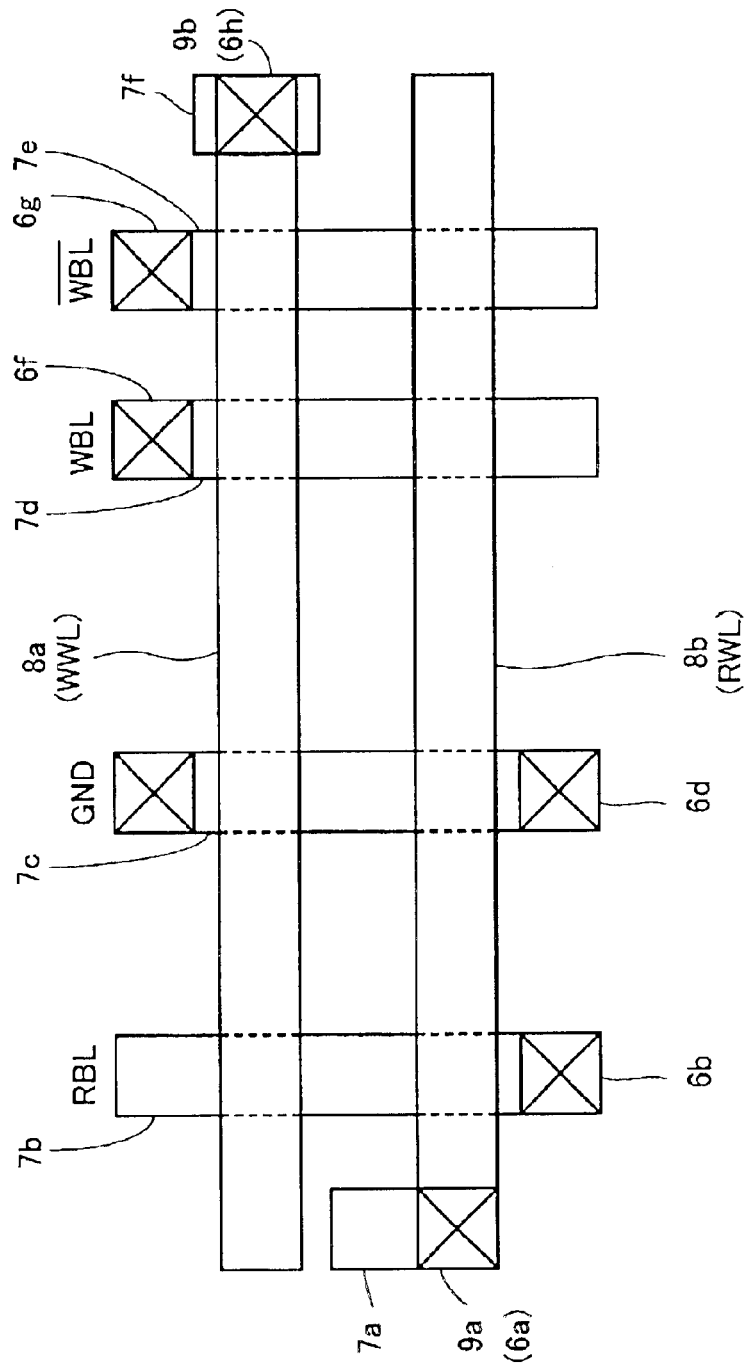
FIG. 16 is a view showing the layout configuration of the upper metal wiring of the memory cell shown in FIG. 15.

Next, the eighth embodiment of the present invention is described in reference to FIGS. 15 and 16. The eighth embodiment is a modified example of the seventh embodiment.

FIGS. 15 and 16 are views showing layouts of a two port memory cell of the present embodiment. FIG. 15 shows a layout up to, and including, the first metal wiring while FIG. 16 shows a layout of the second and third metal wiring. The equivalent circuit diagram of the memory cell of the eighth embodiment is the same as that shown in FIG. 22.

As shown in FIG. 15, two well regions, a P well region and an N well region, are provided in the eighth embodiment and access PMOS transistors P1 and P2 are provided in the same N well region.

The basic structure of the parts other than this is the same as of the case of the seventh embodiment shown in FIG. 13. Accordingly, the same effects as in the seventh embodiment can be expected. In addition, in the case of the present embodiment, the number of contact holes and the number of via holes can be further reduced in comparison with the case of the seventh embodiment and the manufacturing yield can be increased.

Ninth Embodiment

Figure 17:
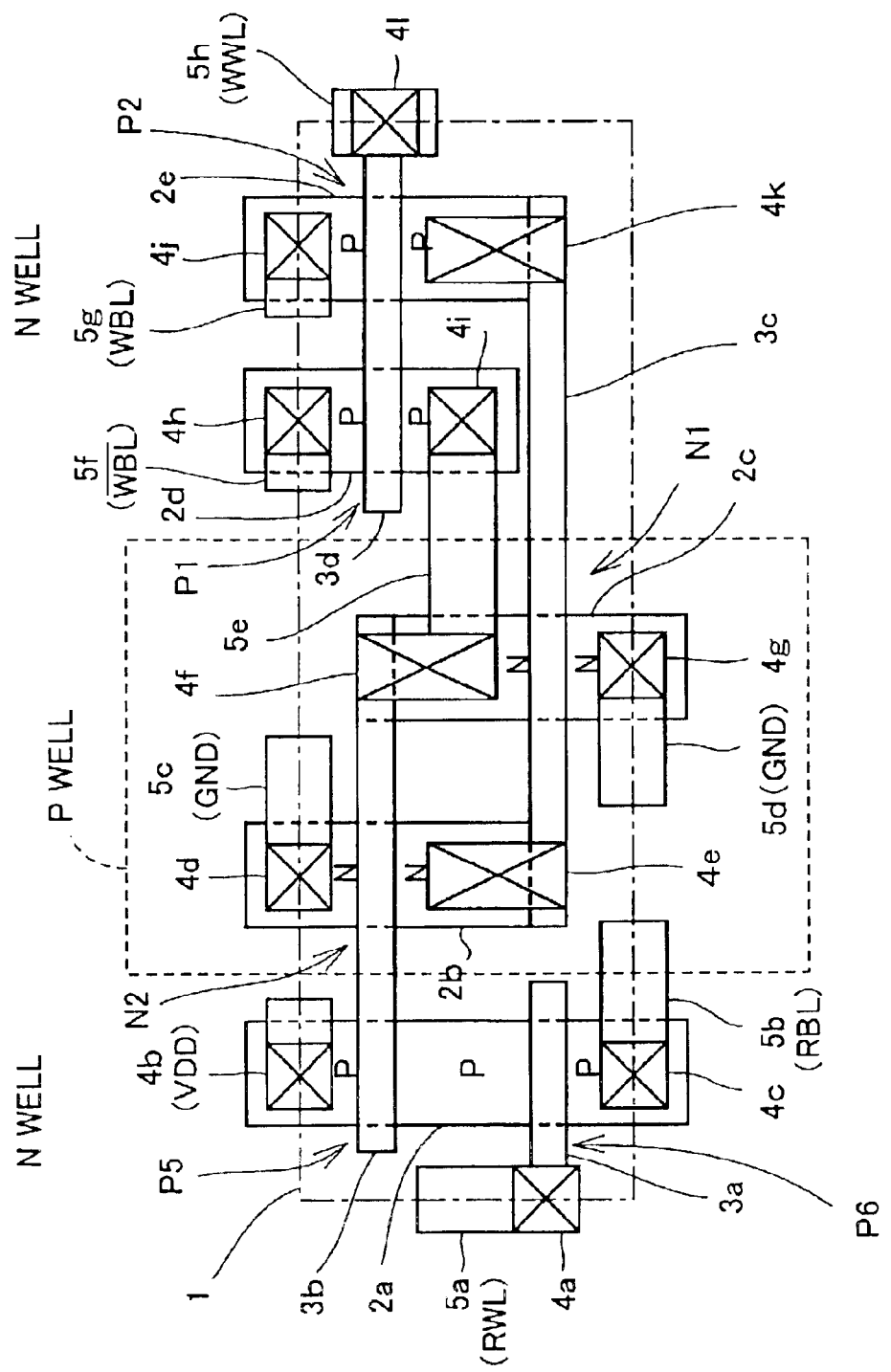
FIG. 17 is a view showing the layout configuration of a loadless-type SRAM multi-port memory cell according to a ninth embodiment of the present invention.
Figure 18:
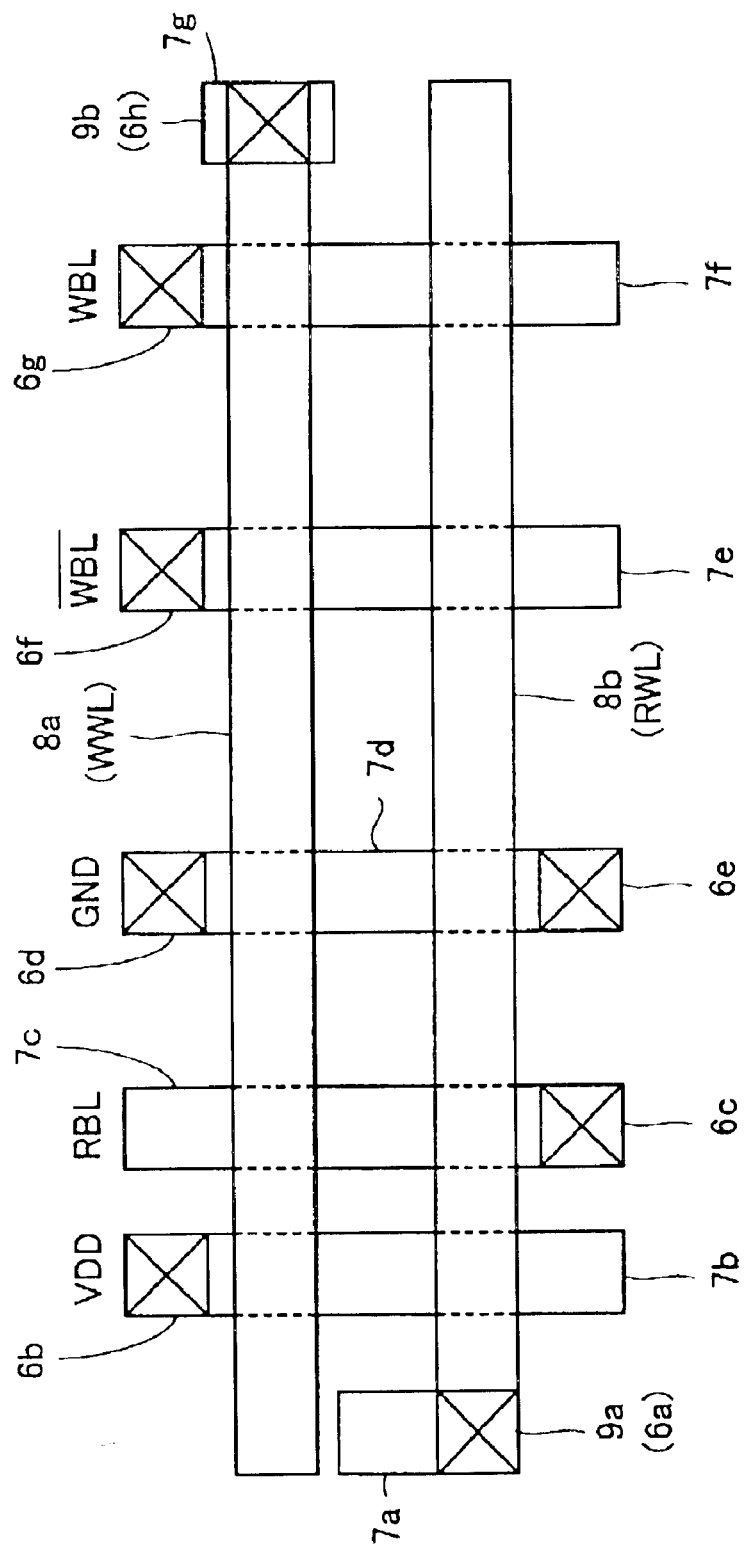
FIG. 18 is a view showing the layout configuration of the upper metal wiring of the memory cell shown in FIG. 17.

Next, the ninth embodiment of the present invention is described in reference to FIGS. 17 and 18. The ninth embodiment is a modified example of the fifth embodiment.

FIGS. 17 and 18 are the views showing layouts of a two port memory cell of the present embodiment. FIG. 17 shows a layout up to, and including, the first metal wiring while FIG. 18 shows a layout of the second and third metal wiring. The equivalent circuit diagram of the memory cell of the ninth embodiment is the same as that shown in FIG. 21.

As shown in FIG. 17, in the present embodiment, access PMOS transistors P1 and P2 are provided in the same N well region and PMOS transistors P5 and P6 are arranged in the N well region on the opposite side. The structure of the parts other than this is approximately the same as that of the fifth embodiment shown in FIG. 9. Accordingly, the same effects as in the fifth embodiment are obtained.

In the ninth embodiment, as described above, access PMOS transistors P1 and P2 are provided in the same N well region and the gates of these transistors are formed of the same polysilicon wire (polysilicon interconnection 3d). Thereby, third metal wire 8a, which becomes word line WWL, and polysilicon interconnection 3d can be connected via one contact hole 4l, first via hole 6h and second via hole 9b. Accordingly, the number of contacts and the number of via holes that are necessary for forming a memory cell of one bit can be reduced in comparison with the fifth and sixth embodiments and the manufacturing yield can be increased.

Tenth Embodiment

Figure 23:
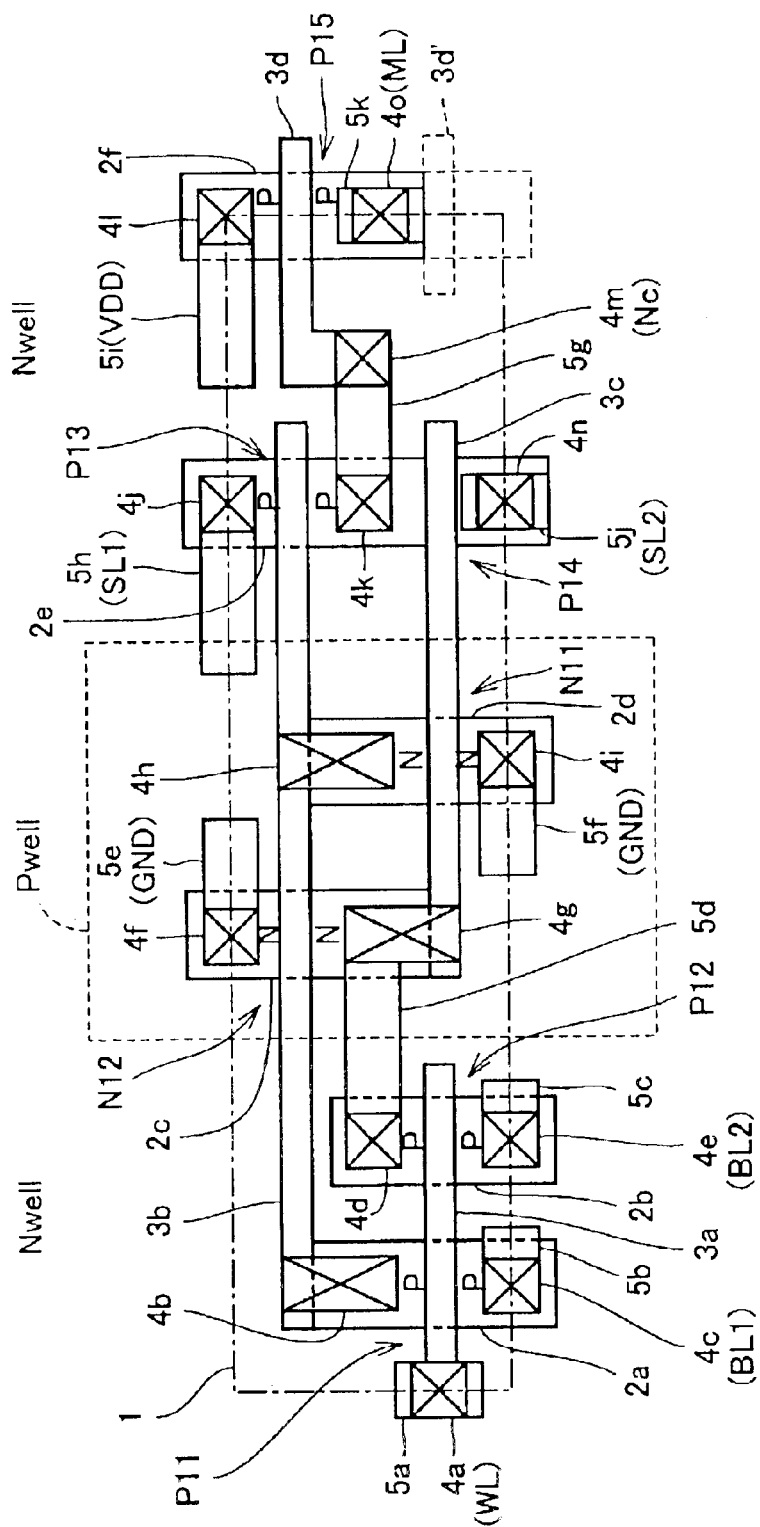
FIG. 23 is a view showing a layout configuration of a memory cell of a loadless-type CAM according to the tenth embodiment of the present invention.
Figure 24:
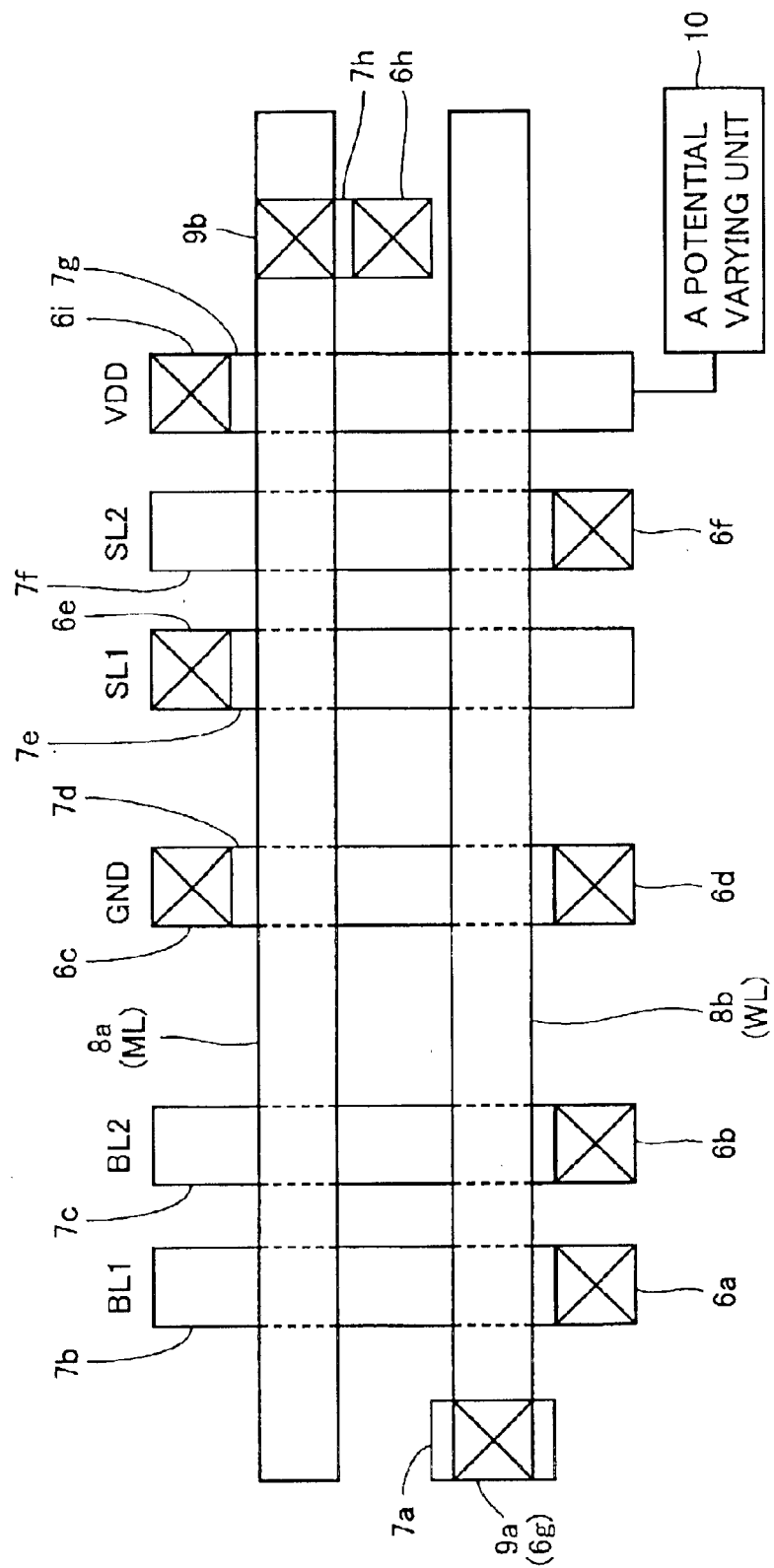
FIG. 24 is a view showing a layout configuration of upper layer metal wires of the memory cell shown in FIG. 23.
Figure 29:
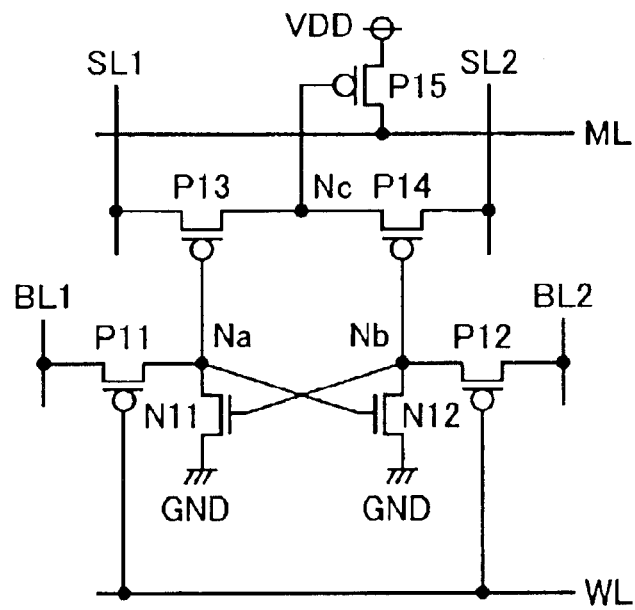
FIG. 29 is an equivalent circuit diagram of a memory cell of the loadless-type CAM according to the tenth and twelfth embodiments of the present invention.

Next, the tenth embodiment of the present invention is described in reference to FIGS. 23, 24 and 29. FIG. 23 is a layout view showing one example of a CAM cell of the tenth embodiment. An equivalent circuit diagram of this CAM cell is shown in FIG. 29.

In recent years, the mounting of a cache memory within a chip has come to be required so as to increase computer speed. This is because it takes a long period of time to access to a large capacity memory outside of the chip; therefore, data stored in an address space of an external memory is transferred to a high speed cache memory within the chip, so that a CPU of a higher speed is achieved. At this time, it is necessary to instantly search concerning whether or not data has been transferred to the cache memory, and a CAM has such a comparison agreement search function.

Next, a circuit configuration of a memory cell in a loadless-type CAM, shown in FIG. 29, is described. The memory circuit portion is the same as in the above described embodiments. That is to say, the memory circuit includes, as shown in FIG. 29, first and second PMOS transistors P11 and P12, first and second NMOS transistors N11 and N12, a word line WL and bit lines BL1 and BL2. Third, fourth and fifth PMOS transistors P13, P14 and P15 are added to this memory circuit.

The gates of third and fourth PMOS transistors P13 and P14 are connected to memory nodes Na and Nb, respectively, the drains of these transistors are connected to a common node Nc and node Nc is connected to the gate of fifth PMOS transistor P15. The sources of third and fourth PMOS transistors P13 and P14 are connected to search lines SL1 and SL2, respectively. The source of fifth PMOS transistor P15 is connected to a power supply line VDD and the drain of this transistor is connected to a match line ML. The CAM cell circuit of the present embodiment is formed as described above.

Next, the comparison operation of the CAM is described. Normal read-out operations and write-in operations are the same as in the above described embodiments. First, in the initial condition, search lines SL1 and SL2 are both posited to be of the H level. When one of third and fourth PMOS transistors P13 or P14 is in the ON condition, the other becomes of the OFF condition. Node Nc is in the condition of being electrically connected to search lines SL1 or SL2; therefore, becomes of the H level.

In the case that memory nodes Na and Nb are posited to be of the H level and the L level, respectively, third PMOS transistor P13 becomes of the OFF condition while fourth PMOS transistor P14 becomes of the ON condition. Accordingly, fifth PMOS transistor P15 becomes of the OFF condition. Since fifth PMOS transistor P15 is in the OFF condition, match line ML and VDD are in the condition of being electrically disconnected. Match line ML has been precharged to the L level in advance.

When the comparison operation is started, either one of search lines SL1 and SL2 is driven from the H level to the L level in accordance with the data that is desired to be compared. At this time, it is posited that search line SL1, as the retrieval data, is driven to the L level while search line SL2 is left at the H level in order to carry out comparison concerning whether the data held at memory node Na is at H or L.

Since memory node Na is at the H level and memory node Nb is at the L level, third PMOS transistor P13 is in OFF condition and fourth PMOS transistor P14 is in the ON condition. Accordingly, node Nc stays at the H level. At this time, match line ML is electrically disconnected from VDD because fifth PMOS transistor P15 is in the OFF condition so as to maintain the L level, which is the initial precharged condition. As a result, information is obtained of the agreement of comparison results.

On the other hand, in the case that memory node Na is at the L level and memory node Nb is at the H level, third PMOS transistor P13 becomes of the ON condition and fourth PMOS transistor P14 becomes of the OFF condition. Accordingly, node Nc converts from the H level to the L level. Therefore, fifth PMOS transistor P15 becomes of the ON condition and the match line ML is electrically connected to power supply line VDD via fifth PMOS transistor P15. Accordingly, the match line ML converts from the L level, which is the initial condition, to the H level and information is obtained of the disagreement of comparison results. After that, search lines SL1 and SL2 are both returned to the H level and the match line ML is again precharged to the L level, thereby the comparison operation is completed.

Next, the layout configuration shown in FIG. 23 is described. FIG. 23 shows the layout from the wells to the contacts. Here, the same numerals are attached to the same components as in the above described embodiment.

N well regions are formed on both sides of P well regions, as shown in FIG. 23. First and second PMOS transistors P11 and P12 are arranged on the N well region on the left side and are aligned in the lateral direction of FIG. 23 while third, fourth and fifth PMOS transistors P13, P14 and P15 are arranged on the N well region on the right side. First and second NMOS transistors N11 and N12 are formed in the P well region, which is in the center.

The drain of first NMOS transistor N11 and the drain of first PMOS transistor P11 are connected to each other at an electrically low impedance via a contact hole (contact portion) 4h, a polysilicon wire 3b and a contact hole (contact portion) 4b. This terminal becomes memory node Na, shown in FIG. 29.

In the same manner, the drain of second NMOS transistor N12 and the drain of second PMOS transistor P12 are connected to each other at an electrically low impedance via a contact hole (contact portion) 4g, a first metal wire 5d and a contact hole (contact portion) 4g. This terminal becomes memory node Nb, shown in FIG. 29.

The gate of third PMOS transistor P13 is formed of a portion of a polysilicon wire 3b and the gate of fourth PMOS transistor P14 is formed of a portion of a polysilicon wire 3c. The drains of third and fourth PMOS transistors P13 and P14 are connected to gate of fifth PMOS transistor P15 formed of a portion of a polysilicon wire 3d via a contact hole (contact portion) 4k, a first metal wire 5g and a contact hole (contact portion) 4m. This terminal becomes memory node Nc, shown in FIG. 29.

The sources of first and second NMOS transistors N11 and N12 are connected to first metal wires 5f and 5e via contact holes (contact portions) 4i and 4f, so that the ground potential (GND) is given to these sources, respectively. The source of fifth PMOS transistor P15 is connected to first metal wire 5i via a contact hole (contact portion) 4l, so that the power supply potential (VDD potential) is given to this source.

The sources of first and second PMOS transistors P11 and P12 are connected to first metal wires 5b and 5c via contact holes (contact portions) 4c and 4e and are connected to bit lines BL1 and BL2, respectively. The sources of third and fourth PMOS transistors P13 and P14 are connected to first metal wires 5h and 5j via contact holes (contact portions) 4j and 4n and are connected to search lines SL1 and SL2, respectively. The drain of fifth PMOS transistor P15 is connected to first metal wire 5k via a contact hole 4o (contact portion) and is connected to match line ML. A polysilicon wire 3a functions as the gates of first and second PMOS transistors P11 and P12 and is connected to a first metal wire 5a via a contact hole (contact portion) 4a and is connected to word line WL.

FIG. 24 shows a layout configuration from the first via holes to the third metal wires. As shown in this figure, second metal wires 7b and 7c, which become bit lines BL1 and BL2, a second metal wire 7d, which becomes the ground line (GND line), second metal wires 7e and 7f, which become search lines SL1 and SL2, and a second metal wire 7g, which becomes the power supply line VDD, are formed in the longitudinal direction wherein second metal wires 7a to 7h are connected to first metal wires 5a to 5k via first via holes 6a to 6i. Word line WL and match line ML are formed of third metal wires 8b and 8a and extend in the lateral direction above second metal wires 7a to 7h, as shown in FIG. 24. This word line WL and match line ML are connected to first metal wires 5a and 5k, respectively, via first via holes 6g and 6h, second metal wires 7a and 7h and second via holes 9a and 9b. Here, though a potential varying unit 10 is connected to second metal wire 7g in the example of FIG. 24, this may be omitted.

By adopting the above described layout, the length of the bit lines and of the search lines can be shortened in comparison with the conventional cell; therefore, a higher read-out and write-in speed as well as a higher speed of the comparison operation can be achieved. In addition, the directions of the polysilicon wires are the same, that is to say, the polysilicon gates extend in the same direction; therefore, control of gate dimensions becomes easy. In addition, fewer transistors are necessary to form the circuit in comparison with a full CMOS-type associative memory; therefore, a scaling down of the area of the memory cell can also be achieved.

Eleventh Embodiment

Figure 25:
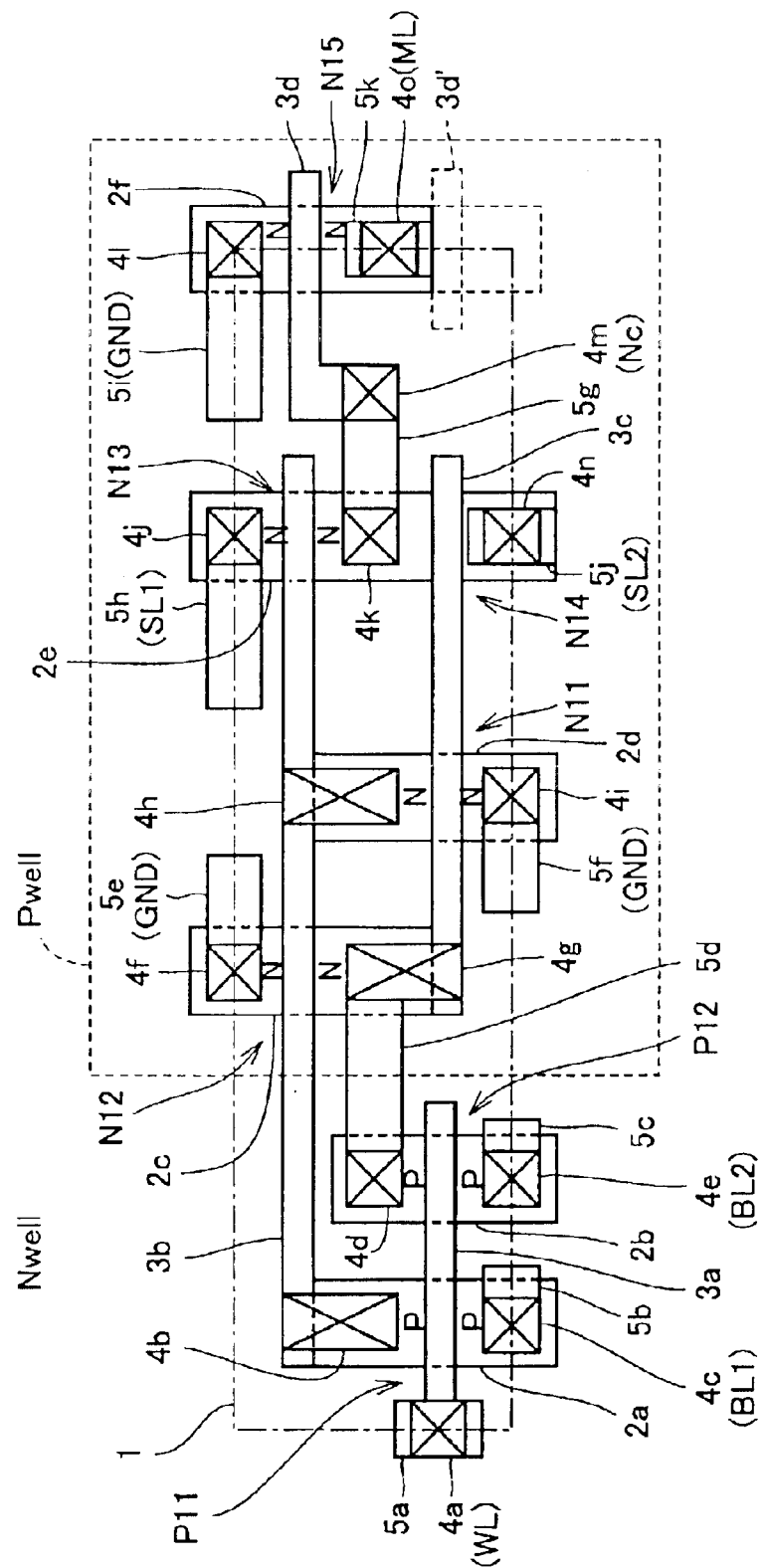
FIG. 25 is a view showing a layout configuration of a memory cell of a loadless-type CAM according to the eleventh embodiment of the present invention.
Figure 26:
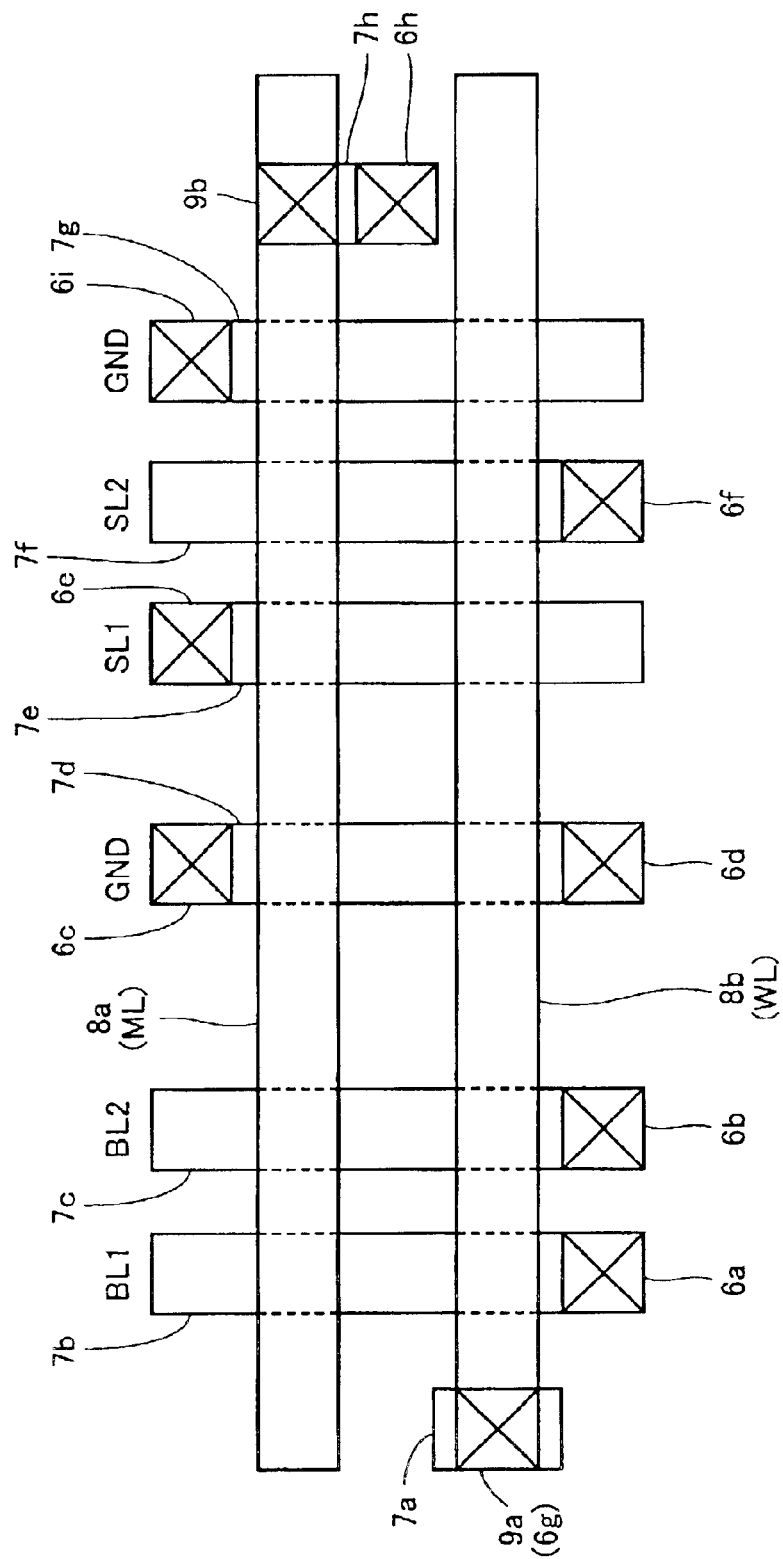
FIG. 26 is a view showing a layout configuration of upper layer metal wires of the memory cell shown in FIG. 25.
Figure 30:
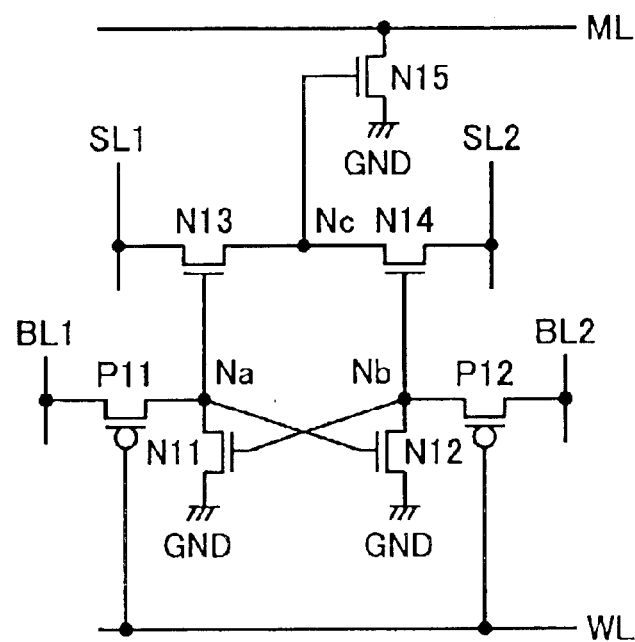
FIG. 30 is an equivalent circuit diagram of a memory cell of the loadless-type CAM according to the eleventh embodiment of the present invention.
Figure 31:
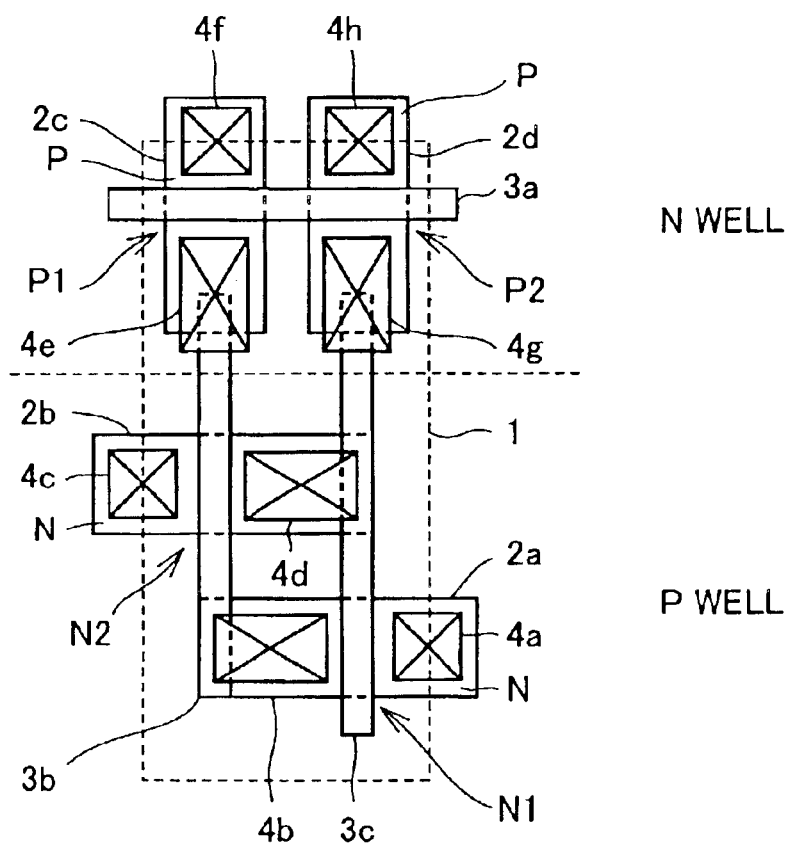
FIG. 31 is a view showing the layout configuration of a loadless-type SRAM memory cell according to a prior art.

Next, the eleventh embodiment of the present invention is described in reference to FIGS. 25, 26 and 30. FIG. 25 is a layout view showing a CAM cell of the present eleventh embodiment. An equivalent circuit diagram of this CAM cell is shown in FIG. 30.

In the present eleventh embodiment, transistors for a comparison operation are formed of N-type transistors and five NMOS transistors are arranged within a P well region. In further detail, N-type diffusion regions 2e and 2f are provided within a P well region and third, fourth and fifth NMOS transistors N13, N14 and N15 are formed on N-type diffusion regions 2e and 2f, as shown in FIG. 25. In addition, a second metal wire 7g is made to function as a GND line, as shown in FIG. 26.

As shown in FIG. 30, the gates of third and fourth NMOS transistors N13 and N14 are connected to memory nodes Na and Nb, respectively, and the drains of these transistors are connected to a common node Nc while node Nc is connected to the gate of fifth NMOS transistor N15. The sources of third and fourth NMOS transistors N13 and N14 are connected to search lines SL1 and SL2, respectively. The source of fifth NMOS transistor N15 is connected to the ground line (GND line) and the drain of this transistor is connected to match line ML. The parts of the configuration other than the above are approximately the same as in the tenth embodiment. Accordingly, the same effects as in the tenth embodiment can also be obtained in the case of the present embodiment.

Next, the comparison operation of the CAM of the present embodiment is described. Normal read-out operations and write-in operations are the same as in the above described embodiment. First, in the initial condition, search lines SL1 and SL2 are both set at the L level. When one of third and fourth NMOS transistors N13 and N14 is in the ON condition, the other becomes of the OFF condition. Node Nc becomes of the condition of being electrically connected to search line SL1 or SL2; therefore, becomes of the L level.

In the case that memory nodes. Na and Nb are posited as being of the H level and of the L level, respectively, third NMOS transistor N13 becomes of the ON condition and fourth NMOS transistor N14 becomes of the OFF condition. Accordingly, fifth NMOS transistor N15 becomes of the OFF condition. Since fifth NMOS transistor N15 is in the OFF condition, match line ML and the GND line are in the condition of being electrically disconnected from each other. Match line ML is precharged to the H level in advance.

When the comparison operation is started, either of search lines SL1 and SL2 is driven from the L level to the H level in accordance with the data that is desired to be compared. At this time, search line SL2 is driven to the H level as the retrieval data and search line SL2 is left at the L level in order to carry out the comparison to determine if the data held at memory node Na is H or L.

Since memory node Na is at the H level and memory node Nb is at the L level, third NMOS transistor N13 becomes of the ON condition and fourth NMOS transistor N14 becomes of the OFF condition. Accordingly, node Nc stays at the L level. At this time, match line ML is electrically disconnected from the GND line because fifth NMOS transistor N15 stays at the OFF condition so as to maintain the H level that is the initial precharged condition. As a result, information is obtained of the agreement of comparison results.

On the other hand, in the case that memory node Na is at the L level and memory node Nb is at the H level, third NMOS transistor N13 becomes of the OFF condition and fourth NMOS transistor N14 becomes of the ON condition. Accordingly, node Nc converts from the L level to the H level. Therefore, fifth NMOS transistor N15 becomes of the ON condition and match line ML is electrically connected to the GND line via fifth NMOS transistor N15. Accordingly, match line ML converts from the H level, which is the initial condition, to the L level and the information is obtained of the disagreement of comparison results. After that, search lines SL1 and SL2 are both returned to the L level and match line ML is again precharged to the H level, thereby the comparison operation is completed.

Twelfth Embodiment

Figure 27:
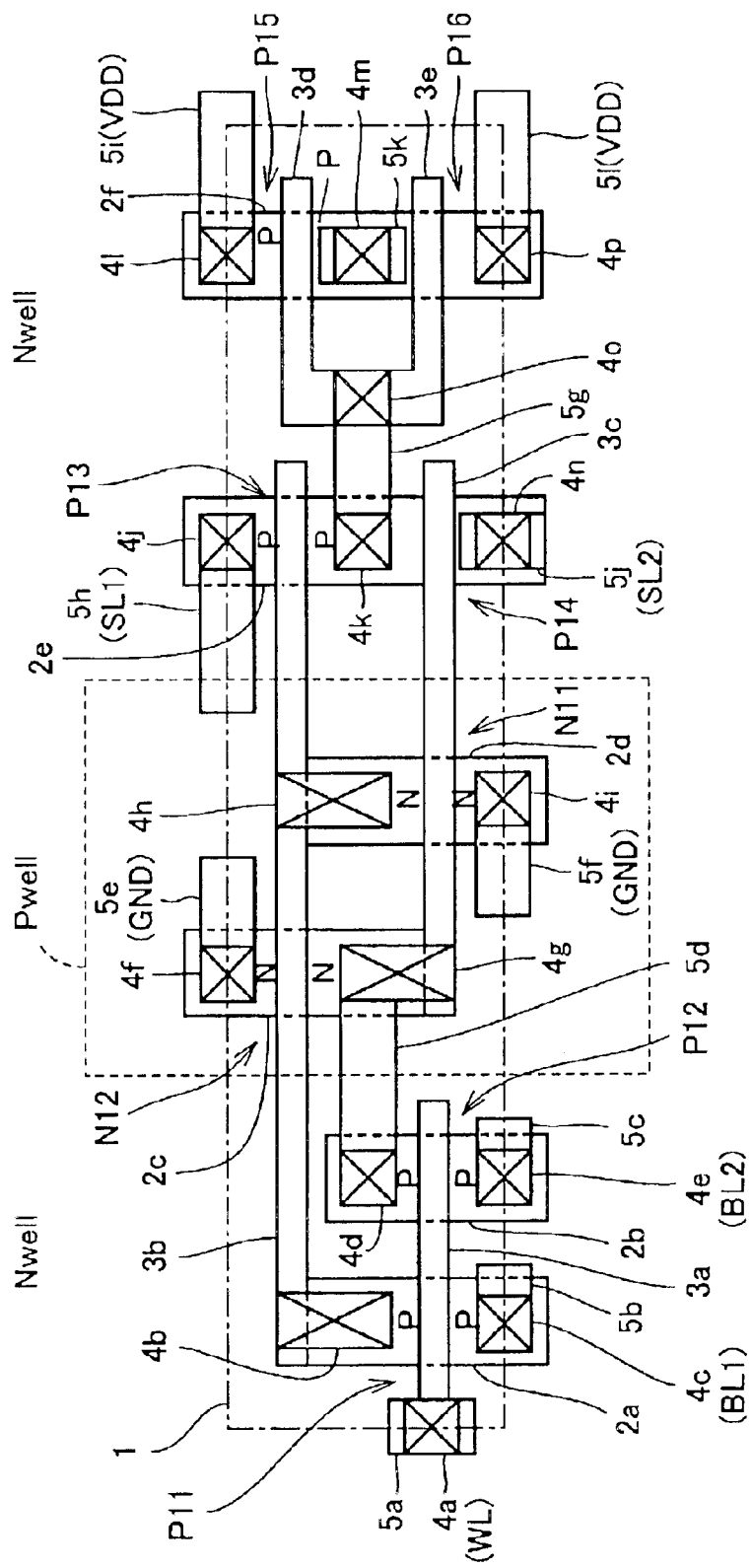
FIG. 27 is a view showing a layout configuration of a memory cell of a loadless-type CAM according to the twelfth embodiment of the present invention.
Figure 28:
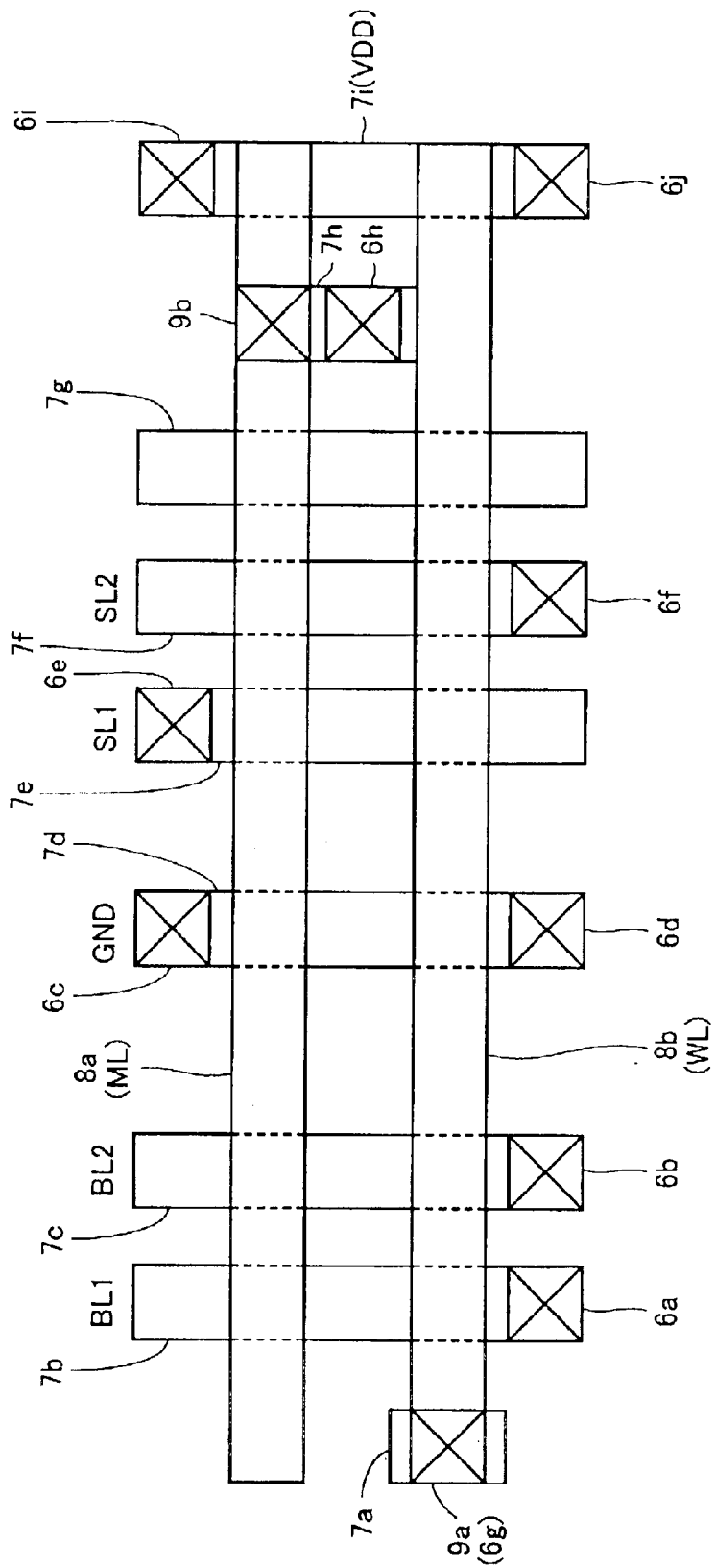
FIG. 28 is a view showing a layout configuration of upper layer metal wires of the memory cell shown in FIG. 27.

Next, the twelfth embodiment of the present invention is described in reference to FIGS. 27 and 28. FIGS. 27 and 28 are layout views showing a CAM cell of the present twelfth embodiment. Here, the equivalent circuit thereof is the same as in FIG. 29.

Sixth PMOS transistor P16, which is equivalent to fifth PMOS transistor P15, is arranged in parallel to fifth PMOS transistor P15 in the present twelfth embodiment. As shown in FIGS. 27 and 28, the source of sixth PMOS transistor P16 is connected to a second metal wire 7i (VDD line) via a contact hole (contact portion) 4p, a first metal wire 5l and first via hole 6j. The drain of sixth PMOS transistor P16 is connected to match line ML via a contact hole 4m, a first metal wire 5k, a first via hole 6h, a second metal wire 7h and a second via hole 9b. The other parts of the configuration, other than the above, are approximately the same as in the tenth embodiment.

By providing sixth PMOS transistor P16 in such a manner, the gate width of fifth PMOS transistor P15 can be substantially increased (for example, doubled in width) in comparison with the tenth embodiment. Accordingly, match line ML can be converted from the L level to the H level faster, so that a higher speed of operation of the CAM cell can be achieved.

Here, though the example shown in FIGS. 27 and 28 is described as an example wherein the concept of the present twelfth embodiment is applied in the cell of the tenth embodiment, the concept of the present twelfth embodiment may be applied in the cell of the eleventh embodiment. The same effects can also be obtained in this case.

Thirteenth Embodiment

Next, the thirteenth embodiment of the present invention is described. The layouts of CAM cells of one bit are described in the above described tenth and eleventh embodiments. However, a great number of these cells are aligned in the directions from upward to downward and from left to right. Therefore, a cell arranged adjacent, on the right, to the cell of FIG. 23 is arranged, for example, on the right side of the cell of FIG. 23 in the condition wherein the cell of FIG. 23 is rotated by 180 degrees. Thereby, fifth PMOS transistor P15, which is the cell on the right side, can be arranged beneath fifth PMOS transistor P15, as shown by the broken line in FIG. 23.

That is to say, fifth PMOS transistors P15 of the memory cells adjacent to each other in the lateral direction can be aligned in the longitudinal direction, as shown in FIG. 23. Thereby, a polysilicon wire 3d, which becomes the gate of fifth PMOS transistor P15, and a polysilicon wire 3d', which becomes the gate of fifth PMOS transistor P15 of another memory cell, are arranged side-by-side in the direction from upward to downward.

In addition, a diffusion region 2f in FIG. 23 is extended downward and the above described polysilicon wire 3d' is made to extend over this diffusion region 2f, thereby an impurity diffusion region, which is an output portion of match line ML, can be shared between the adjacent memory cells.

By allowing the adjacent cell to share the impurity diffusion region, which is the output portion of match line ML, in such a manner, the junction capacitance of the impurity diffusion region, which becomes an additional capacitance of the output portion of match line ML, can be reduced. Thereby, it becomes possible to increase the speed of the operations of the cells and to lower the amount of power consumed.

In addition, since polysilicon wires can be arranged in the direction from upward to downward between adjacent cells of two bits, the length in the lateral direction of the entirety of the CAM cells can be shortened in comparison with the case where polysilicon wires are aligned in the lateral direction. Accordingly, the area of the CAM cells can be further reduced.

Fourteenth Embodiment

Next, the fourteenth embodiment of the present invention is described. The VDD line is connected to the source of fifth PMOS transistor P15 in the above described tenth and twelfth embodiments. When a CAM cell is in the standby condition, node Nc is precharged to the H level and match line ML is precharged to the L level and fifth PMOS transistor P15 is in the OFF condition; therefore, match line ML and the VDD line are in the condition of being electrically disconnected from each other.

In recent years, however, an increase in the speed of CAM cells has come to be required; therefore, the threshold values of the transistors are lowered so that the saturated current becomes greater, thereby an increase in speed is achieved. When the threshold value of the transistors is lowered; however, a sub-threshold leak current, which flows between the sources and the drains in the OFF condition of the transistors, becomes greater. Therefore, a wasteful amount of power is consumed.

At the time of standby of the cells of the tenth and twelfth embodiments, for example, a sub-threshold leak current increases in fifth PMOS transistor P15, thereby there is a possibility that a great amount of leak current may flow between match line ML and the VDD line.

Thus, at the time of standby, the potential given to the source of fifth PMOS transistor P15 can be changed in accordance with the condition of the comparison operation instead of giving a fixed potential to the source of fifth PMOS transistor P15 from the VDD line. For example, a potential varying unit 10 is connected to a second metal wire 7g, which becomes the VDD line, as shown in FIG. 24. Concretely, the potential of the VDD line is made variable by means of an external driver circuit, which is not shown, having the VDD line as a signal wire.

Then, the VDD potential is given to the source of fifth PMOS transistor P15 at the time of the comparison operation while the potential of the L level, which is lower than the VDD potential, is given to the source of fifth PMOS transistor P15 in order to suppress leak current at the time of standby.

Thereby, even in the case that the sub-threshold leak current in fifth PMOS transistor P15 is great, the potential of the source of fifth PMOS transistor P15 and the potential of match line ML, which is connected to the drain of fifth PMOS transistor P15, can both be set at the L level at the time of standby. Accordingly, a penetrating current can be prevented from flowing through fifth PMOS transistor P15 at the time of standby, thereby the amount of power consumed in the CAM cell at the time of standby can be reduced.

Though the embodiments of the present invention are described above, it is foreseen from the beginning that the characteristics of the respective embodiments can be appropriately combined. In addition, devices of the above described embodiments may be formed in a bulk semiconductor substrate or may be formed on a substrate having an SOI (Silicon On Insulator) structure.

According to the present invention, the first and second bit lines can be made short and, thereby, the wire capacitance of the bit lines can be made small. In addition, since the intervals between the bit lines can be kept wide, the capacitance between the bit lines can also be made small. Furthermore, the dispersion of the width of the patterns for forming the gates, and the like, or of the pattern formation positions can be made small after the photolithographic process and, in addition, the gates can be allowed to shift to a certain degree in the longitudinal direction and, therefore, it becomes easy to secure a margin for the dispersion of the gates or of the diffusion regions at the time of formation.

The semiconductor memory device of one aspect may include: third and fourth access MOS transistors of the first conductive type, formed in the second and third wells, respectively; another word line connected to the gates of the third and fourth access MOS transistors; and third and fourth bit lines connected to the sources of the third and fourth access MOS transistors, respectively. In this case, the fifth and sixth diffusion regions of the first conductive type for forming the sources/drains of the third and fourth access MOS transistors and the first, second, third and fourth diffusion regions extend in the same direction while the gates of the third and fourth access MOS transistors, the gates of the first and second access MOS transistors and the gates of the first and second driver MOS transistors extend in the same direction.

The present invention can also be applied to a so-called two port memory cell that is provided with the third and fourth access MOS transistors, the second word line and the third and fourth bit lines in the above described manner so as to obtain the same effects as in the above described case.

It is preferable for the above described first and second bit lines to be formed on the second well and for the third and fourth bit lines to be formed on the third well. By arranging a pair of bit lines for each port above each well, respectively, in the above described manner, interference between the ports can be prevented.

The above described semiconductor memory device may include: first and second MOS transistors of the first conductive type, formed in the second and third wells; a word line for read out, connected to the gate of the second MOS transistor; and a bit line for read out, connected to the source of the second MOS transistor. In this case, the gate of the first MOS transistor is connected to the gate of the second driver MOS transistor, a power supply potential is given to the source of the first MOS transistor, fifth and sixth diffusion regions of the first conductive type for forming the sources/drains of the first and second MOS transistors and the first, second, third and fourth diffusion regions extend in the same direction and the gates of the first and second MOS transistors, the gates of the first and second access MOS transistors and the gates of the first and second driver MOS transistors extend in the same direction.

In addition, the above described semiconductor memory device may include: first and second MOS transistors of the second conductive type, formed in the first well; a word line for read out, connected to the gate of the second MOS transistor; and a bit line for read out, connected to the source of the second MOS transistor. In this case, the gate of the first MOS transistor is connected to the gate of the second driver MOS transistor, the drain of the first MOS transistor is set at the ground potential, fifth and sixth diffusion regions of the first conductive type for forming the sources/drains of the first and second MOS transistors, the first, second, third and fourth diffusion regions extend in the same direction and the gates of the first and second MOS transistors, the gates of the first and second access MOS transistors and the gates of the first and second driver MOS transistors extend in the same direction.

The present invention can also be applied to a two port memory cell that is provided with a port for read out in the above manner. In this case, the same effects as in the above described case can also be obtained.

The above described semiconductor memory device preferably includes: a third well of the second conductive type formed on the side of the first well opposite to the second well; fifth, sixth and seventh MOS transistors of the first conductive type formed in the third well; first and second search lines connected to the sources of the fifth and sixth MOS transistors and extending in the direction perpendicular to the direction in which the first, second and third wells are aligned; and a match line connected to the drain of the seventh MOS transistor and extending in the direction in which the first, second and third wells are aligned. In this case, the source of the above described seventh MOS transistor may be connected to a power supply line and a potential varying unit for varying the potential of the power supply line may be connected to the power supply line.

In addition, the above described semiconductor memory device may include: fifth, sixth and seventh MOS transistors of the second conductive type formed in the first well; first and second search lines connected to the sources of the fifth and sixth MOS transistors and extending in the direction perpendicular to the direction in which the first, second and third wells are aligned; and a match line connected to the drain of the seventh MOS transistor and extending in the direction in which the first, second and third wells are aligned.

The above described semiconductor memory device may include an eighth MOS transistor that shares a drain with the seventh MOS transistor. In this case, the gate of the seventh MOS transistor and the gate of the eighth MOS transistor are electrically connected to each other.

In addition, it is preferable to make the fifth, sixth and seventh diffusion regions for forming the sources/drains of the above described fifth, sixth and seventh MOS transistors extend in the same direction that the first to fourth diffusion regions extend and to make the gates of the fifth, sixth and seventh MOS transistors extend in the same direction that the gates of the first to fourth MOS transistors extend.

The above described semiconductor memory device includes first and second memory cells adjacent to each other along the direction in which the match line extends. In this case, the seventh MOS transistor of the first memory cell and the seventh MOS transistor of the second memory cell are arranged side-by-side in the direction perpendicular to the direction in which the match line extends.

The present invention is not only applicable in a device formed on a bulk semiconductor substrate but also applicable in a device formed on an SOI (Silicon On Insulator) substrate.

The present invention is useful for a semiconductor memory device having loadless four-transistors type memory cells, in particular, is useful for a static-type memory or for an associative memory having search lines and match lines. In the case of an associative memory, the wire length of search lines can be shortened; therefore, an increase in the speed of access time can be achieved. In addition, in the case that the source of a MOS transistor connected to the match line is connected to the power supply line and a potential varying unit is connected to this power supply line, the leak current at the time of standby can be reduced, so that the amount of power consumed at the time of standby can be reduced.

In the case that the above described semiconductor memory device includes a MOS transistor connected to a match line and MOS transistors sharing a drain, the speed of the change in the potential level of the match line is increased so as to achieve an increase in the speed of the device.

In addition, diffusion regions for forming the sources/drains of the respective MOS transistor are made to extend in the same direction and the gates of the respective MOS transistors are made to extend in the same direction, thereby the dispersion in the width, or in the pattern formation positions, of patterns for forming the gates or the like can be reduced after photolithography.

In the case that the above described semiconductor memory device has first and second memory cells adjacent to each other in the direction in which a match line extends and a MOS transistor of the first cell and a MOS transistor of the second memory cell are arranged side-by-side in the direction perpendicular to the direction in which the match line extends, the area of the memory cells can be reduced in the direction in which the match line extends. In addition, in the case that these two MOS transistors share an impurity diffusion region connected to the match line, the output load capacitance of the match line can be reduced, so that it becomes possible to increase the speed of the operation and to reduce the amount of power consumed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a first well of a first conductive type;
    second and third wells of a second conductive type, formed on both sides of said first well;
    first and second access MOS (metal oxide semiconductor) transistors of the first conductive type, each formed on one of said second or third well respectively;
    first and second driver MOS transistors of the second conductive type, formed on said first well;
    a word line connected to each of the gates of said first and second access MOS transistors, and extending in the direction along which said first, second and third wells are aligned; and
    first and second bit lines connected to the sources of said first and second access MOS transistors, respectively, and extending in the direction perpendicular to the direction along which said first, second and third wells are aligned, wherein
    first and second diffusion regions of the first conductive type for forming the sources/drains of said first and second access MOS transistors, and third and fourth diffusion regions, of the second conductive type for forming the sources/drains of said first and second driver MOS transistors, extend in the same direction, and
    the gates of said first and second access MOS transistors and the gates of said first and second driver MOS transistors extend in the same direction.

2. The semiconductor memory device according to claim 1, wherein said first access MOS transistor is arranged on said second well and said second access MOS transistor is arranged on said third well.

3. The semiconductor memory device according to claim 1, further comprising a conductive part for directly connecting between the drain of said first access MOS transistor and the drain of said first driver MOS transistors.

4. The semiconductor memory device according to claim 1, wherein the gates of said first and second access MOS transistors and the gates of said first and second driver MOS transistors extend in the form of a line in the direction perpendicular to the direction in which said first, second and third wells extend.

5. The semiconductor memory device according to claim 1, comprising:
    third and fourth access MOS transistors of the first conductive type, formed on said second and third wells, respectively;
    another word line connected to the gates of said third and fourth access MOS transistors; and
    third and fourth bit lines connected to the sources of said third and fourth access MOS transistors, respectively, wherein
    fifth and sixth diffusion regions of the first conductive type for forming the sources/drains of said third and fourth access MOS transistors and said first, second, third and fourth diffusion regions extend in the same direction, and
    the gates of said third and fourth access MOS transistors, and the gates of said first and second access MOS transistors and the gates of said first and second driver MOS transistors extend in the same direction.

6. The semiconductor memory device according to claim 5, wherein said first and second bit lines are formed on said second well and the third and fourth bit lines are formed on the third well.

7. The semiconductor memory device according to claim 1, comprising:
    first and second MOS transistors of the first conductive type, formed on said second or third well;
    a word line for read out, connected to the gate of said second MOS transistor; and
    a bit line for read out, connected to the source of said second MOS transistor, wherein
    the gate of said first MOS transistor is connected to the gate of said second driver MOS transistor and a power supply potential is given to the source of said first MOS transistor,
    fifth and sixth diffusion regions of the first conductive type for forming the sources/drains of said first and second MOS transistors and said first, second, third and fourth diffusion regions extend in the same direction, and
    the gates of said first and second MOS transistors, and the gates of said first and second access MOS transistors and the gates of said first and second driver MOS transistors extend in the same direction.

8. The semiconductor memory device according to claim 1, comprising:

first and second MOS transistors of the second conductive type, formed on said first well;

a word line for read out, connected to the gate of said second MOS transistor; and a bit line for read out, connected to the source of said second MOS transistor, wherein the gate of said first MOS transistor is connected to the gate of said second driver MOS transistor and the drain of said first MOS transistor is set at a ground potential, fifth and sixth diffusion regions of the second conductive type for forming the sources/drains of said first and second MOS transistors and said first, second, third and fourth diffusion regions extend in the same direction, and the gates of said first and second MOS transistors, and the gates of said first and second access MOS transistors and the gates of said first and second driver MOS transistors extend in the same direction.

9. A semiconductor memory device comprising:

a first well of a first conductive type;

a second well of a second conductive type formed adjacent said first well;

first and second access MOS (metal oxide semiconductor) transistors of the first conductive type, formed on said second well;

first and second driver MOS transistors of the second conductive type, formed on said first well;

a word line extending in the direction along which said first and second wells are adjacently aligned, and said word line connected to each of the gates of said first and second access MOS transistors; and first and second bit lines connected to the sources of said first and second access MOS transistors, respectively, and extending in the direction perpendicular to the direction in which said word line extends, wherein first and second diffusion regions, of the first conductive type for forming the sources/drains of said first and second access MOS transistors, and third and fourth diffusion regions, of the second conductive type for forming the sources/drains of said first and second driver MOS transistors, extend in the same direction, and the gates of said first and second access MOS transistors and the gates of said first and second driver MOS transistors extend in the same direction.

10. The semiconductor memory device according to claim 9, comprising:

first and second MOS transistors of the second conductive type, formed on said first well;

a word line for read out, connected to the gate of said second MOS transistor; and a bit line for read out, connected to the source of said second MOS transistor, wherein the gate of said first MOS transistor is connected to the gate of said second driver MOS transistor and the drain of said first MOS transistor is set at a ground potential, fifth and sixth diffusion regions of the second conductive type for forming the sources/drains of said first and second MOS transistors and said first, second, third and fourth diffusion regions extend in the same direction, and the gates of said first and second MOS transistors, and the gates of said first and second access MOS transistors and the gates of said first and second driver MOS transistors extend in the same direction.

11. A semiconductor memory device comprising:

a first well of a first conductive type;

a second well of a second conductive type formed adjacent to said first well;

first and second MOS (Metal Oxide Semiconductor) transistors of the first conductive type formed on said second well;

third and fourth MOS transistors of the second conductive type formed on said first well;

a word line connected to the gates of said first and second MOS transistors and extending in the direction in which said first and second wells are adjacently aligned;

first and second bit lines connected to the sources of said first and second MOS transistors, respectively, and extending in the direction perpendicular to the direction in which said first and second wells are adjacently aligned, wherein first and second diffusion regions, of the first conductive type forming the sources/drains of said first and second MOS transistors, and third and fourth diffusion regions, of the second conductive type forming the sources/drains of said third and fourth MOS transistors, extend in the same direction, and the gates of said first and second MOS transistors and the gates of said third and fourth MOS transistors extend in the same direction;

a third well of the second conductive type formed on the side of said first well opposite to said second well;

fifth, sixth and seventh MOS transistors of the first conductive type formed within said third well;

first and second search lines connected to the sources of said fifth and sixth MOS transistors and extending in the direction perpendicular to the direction in which said first, second and third wells are aligned; and a match line connected to the drain of said seventh MOS transistor and extending in the direction in which said first, second and third wells are aligned.

12. The semiconductor memory device according to claim 11, wherein the source of said seventh MOS transistor is connected to a power supply line and a potential varying means varying the potential of the power supply line is connected to said power supply line.

13. A semiconductor memory device comprising:

a first well of a first conductive type;

a second well of a second conductive type formed adjacent to said first well;

first and second MOS (Metal Oxide Semiconductor) transistors of the first conductive type formed on said second well;

third and fourth MOS transistors of the second conductive type formed on said first well;

a word line connected to the gates of said first and second MOS transistors and extending in the direction in which said first and second wells are adjacently aligned;

first and second bit lines connected to the sources of said first and second MOS transistors, respectively, and extending in the direction perpendicular to the direction in which said first and second wells are adjacently aligned, wherein first and second diffusion regions, of the first conductive type forming the sources/drains of said first and second MOS transistors, and third and fourth diffusion regions, of the second conductive type forming the sources/drains of said third and fourth MOS transistors, extend in the same direction, and the gates of said first and second MOS transistors and the gates of said third and fourth MOS transistors extend in the same direction;

fifth, sixth and seventh MOS transistors of the second conductive type formed within said first well;

first and second search lines connected to the sources of said fifth and sixth MOS transistors and extending in the direction perpendicular to the direction in which said first, and second wells are aligned; and a match line connected to the drain of said seventh MOS transistor and extending in the direction in which said first, and second are aligned.

14. The semiconductor memory device according to claim 11, comprising an eighth MOS transistor that shares a drain with said seventh MOS transistor, wherein the gate of said seventh MOS transistor and the gate of said eighth MOS transistor are electrically connected to each other.

15. The semiconductor memory device according to claim 11, wherein fifth, sixth and seventh diffusion regions forming the sources/drains of said fifth, sixth and seventh MOS transistors and said first to fourth diffusion regions are made to extend in the same direction, and the gates of said fifth, sixth and seventh MOS transistors and the gates of said first to fourth MOS transistors are made to extend in the same direction.

16. The semiconductor memory device according to claim 11, comprising first and second memory cells adjacent to each other along the direction in which said match line extends, wherein said seventh MOS transistor of said first memory cell and said seventh MOS transistor of said second memory cell are arranged side-by-side in the direction perpendicular to the direction in which said match line extends.

* * * * *